(12) United States Patent
Hewitt et al.

(10) Patent No.: US 7,039,846 B2
(45) Date of Patent: May 2, 2006

(54) ENHANCED TURBO PRODUCT CODE DECODER SYSTEM UTILIZING A CODEWORD ORGANIZATION METHOD

(75) Inventors: Eric John Hewitt, Pullman, WA (US); Alan Robert Danielson, Moscow, ID (US); Peter Sean Ladow, Redmond, WA (US); Tom Leroy Hansen, Pullman, WA (US)

(73) Assignee: Comtech Telecommunications Corp., Melville, NY (US)

( * ) Notice: Subject to any disclaimer, the term of this patent is extended or adjusted under 35 U.S.C. 154(b) by 0 days.

(21) Appl. No.: 10/447,717

(22) Filed: May 28, 2003

(65) Prior Publication Data

US 2004/0010747 A1    Jan. 15, 2004

Related U.S. Application Data

(63) Continuation of application No. 09/826,443, filed on Apr. 4, 2001, now abandoned.

(60) Provisional application No. 60/194,570, filed on Apr. 4, 2000.

(51) Int. Cl.
*H03M 13/00* (2006.01)
*H03M 13/03* (2006.01)

(52) U.S. Cl. ........................... 714/755; 714/786
(58) Field of Classification Search ................ 714/755, 714/780, 786, 752
See application file for complete search history.

(56) References Cited

U.S. PATENT DOCUMENTS 4,295,218 A    10/1981 Tanner (Continued)

FOREIGN PATENT DOCUMENTS

EP    0 625 829 A2    11/1994

(Continued)

OTHER PUBLICATIONS

"AHA Galaxy TPC Windows Evaluation Software", Advanced Hardware Architectures Preliminary Product Brief, Published after Apr. 4, 2000.

(Continued)

*Primary Examiner*—Albert Decady
*Assistant Examiner*—Esaw Abraham
(74) *Attorney, Agent, or Firm*—Haverstock & Owens LLP

(57) ABSTRACT

A method and apparatus for decoding a linear block encoded string of information bits comprising: converting the string into a plurality of codewords. Performing hard and soft decisions on each codeword to generate a hard and soft decision vector. Computing the syndrome and finding the location of the two minimum values by Galois Field Arithmetic. Designating these values LOW1 and LOW2 and xoring with a Nc1, thus generating Nc2. Swapping Nc1 with Nc2 and determining the lowest soft decision value, Min1 and a next lowest value, Min2. The two bit locations creating Min1 are designated as MinA and MinB. MinA being replaced with Min2 minus the value MinA. MinB being replaced with Min2 minus the value at MinB. Generating an output codeword by subtracting Min1 from all other bit locations values and 2's complementing all soft values with 0 in their location. Creating the new soft value vector. Some embodiments include a system and method that organizes an encoded codeword. The encoded codeword has several codeword bits. The method receives the encoded codeword, assigns multiple codeword bits to at least one memory address in a plurality of memory addresses, and iteratively decodes the received codeword by utilizing the plurality of memory addresses in a predetermined order. The predetermined order is based on a dimension of the received codeword.

19 Claims, 16 Drawing Sheets

U.S. PATENT DOCUMENTS

| | | | |
|---|---|---|---|
| 4,564,945 A | 1/1986 | Glover et al. ............... 371/38 |
| 4,763,331 A | 8/1988 | Matsumoto |
| 4,821,290 A * | 4/1989 | Hingorani et al. .......... 375/242 |
| 4,845,714 A | 7/1989 | Zook |
| 5,157,671 A | 10/1992 | Karplus |
| 5,369,652 A | 11/1994 | Bailey et al. ............. 371/40.1 |
| 5,392,299 A | 2/1995 | Rhines et al. ............. 371/37.5 |
| 5,406,570 A | 4/1995 | Berrou et al. |
| 5,446,747 A | 8/1995 | Berrou |
| 5,499,254 A | 3/1996 | Ikekawa et al. |
| 5,541,955 A | 7/1996 | Jacobsmeyer ............... 375/222 |
| 5,559,506 A | 9/1996 | Leitch |
| 5,563,897 A | 10/1996 | Pyndiah et al. |
| 5,566,191 A | 10/1996 | Ohnishi et al. |
| 5,657,354 A | 8/1997 | Thesling, III et al. ...... 375/332 |
| 5,684,811 A | 11/1997 | Doran |
| 5,703,911 A | 12/1997 | Lin et al. .................... 375/341 |
| 5,719,884 A | 2/1998 | Roth et al. |
| 5,721,745 A | 2/1998 | Hladik et al. |
| 5,721,746 A | 2/1998 | Hladik et al. |
| 5,729,560 A | 3/1998 | Hagenauer et al. |
| 5,761,248 A | 6/1998 | Hagenauer et al. ......... 375/340 |
| 5,787,127 A | 7/1998 | Ono et al. ................... 375/341 |
| 5,787,239 A | 7/1998 | Horie et al. ................ 395/114 |
| 5,802,116 A | 9/1998 | Baker et al. ................ 375/241 |
| 5,841,818 A | 11/1998 | Lin et al. .................... 375/341 |
| 5,901,182 A | 5/1999 | Kot .............................. 375/341 |
| 5,907,582 A | 5/1999 | Yi ............................... 375/259 |
| 5,930,272 A | 7/1999 | Thesling |
| 5,937,016 A | 8/1999 | Choi ............................ 375/341 |
| 5,999,111 A * | 12/1999 | Park et al. .................... 341/67 |
| 6,104,758 A | 8/2000 | Kaku et al. ................. 375/265 |
| 6,145,111 A * | 11/2000 | Crozier et al. .............. 714/755 |
| 6,188,797 B1 * | 2/2001 | Moledina et al. .......... 382/246 |
| 6,367,047 B1 | 4/2002 | McAuliffe et al. ......... 714/755 |
| 6,421,804 B1 * | 7/2002 | Lee ............................ 714/755 |
| 6,460,162 B1 * | 10/2002 | Buda et al. ................. 714/807 |
| 6,499,128 B1 | 12/2002 | Gerlach et al. ............ 714/755 |
| 6,526,531 B1 | 2/2003 | Wang ........................ 714/704 |
| 6,526,538 B1 * | 2/2003 | Hewitt ....................... 714/780 |
| 6,539,367 B1 | 3/2003 | Blanksby et al. ............. 706/14 |
| 6,594,318 B1 | 7/2003 | Sindhushayana ............ 375/262 |
| 6,725,411 B1 | 4/2004 | Gerlach et al. ............. 714/755 |
| 6,795,507 B1 * | 9/2004 | Xin et al. ................... 375/265 |
| 2002/0101915 A1 | 8/2002 | Zhang et al. ............... 375/222 |
| 2002/0150167 A1 | 10/2002 | Demjanenko et al. ...... 375/259 |

FOREIGN PATENT DOCUMENTS

| | | |
|---|---|---|
| FR | 2 778 289 | 11/1999 |
| WO | WO 00/19616 | 4/2000 |

OTHER PUBLICATIONS

"Turbo Product Code Encoding and Decoding with Quadrature Amplitude Modulation (QAM)", Advanced Hardware Architectures Application Note, Published after Apr. 4, 2000, pp. 1-11.

"AHA4501 TPC EVM ISA Evaluation Module", Advanced Hardware Architectures Preliminary Product Brief, Published after Apr. 4, 2000.

"Turbo Product Codes for LMDS", Advanced Hardware Architectures Application Note, Published in 1999, pp. 1-9.

"Using Multiple AHA4501 Devices in Parallel for Higher Data Rates", Advanced Hardware Architectures Application Note, Published after Apr. 4, 2000, pp. 1-5.

"AHA4501 Astro", Advanced Hardware Architecture Product Specification, Published after Apr. 4, 2000, pp. 1-36.

"Primer: Turbo Product Codes", Advanced Hardware Architectures Application Note, Published after Apr. 4, 2000, pp. 1-8.

"Use and Performance of Shortened Codes with the AHA4501 Turbo Product Code Encoded/ Decoder", Advanced Hardware Architectures Application Note, Published after Apr. 4, 2000, pp. 1-5.

"AHA4501 Astro 36 mbits/sec Turbo Product Code Encoder/Decoder", Advanced Hardware Architectures Preliminary Product Brief , Published after Apr. 4, 2000, pp. 1-5.

"Galaxy Core Generator Turbo Product Code Decoder Cores", Advanced Hardware Architecture Preliminary Product Brief, Published after Apr. 4, 2000, pp. 1-3.

"AHA Turbo Product Codes Frequently Asked Questions", Advanced Hardware Architectures Application Note, Published after Apr. 4, 2000, pp. 1-5.

"AHA4501 Designer's Guide", Advanced Hardware Architectures Application Note, Published after Apr. 4, 2000, pp. 1-9.

Use and Performance of the AHA4501 Turbo Product Code Encoder/Decoder with Differential Phase Shift Keying (DPSK), Advanced Hardware Architectures Application Note, Published after Apr. 4, 2000, pp. 1-4.

"Galaxy TPC Cores Turbo Product Code Encoder/Decoder Cores", Advanced Hardware Architectures Preliminary Product Brief, Published after Apr. 4, 2000, pp. 1-3.

"AHA4501 TPC Windows Evaluation Software", Advanced Hardware Architectures Preliminary Product Brief, Published after Apr. 4, 2000.

Pascale Ferry et al., "Turbo Decoder Synchronization Procedure. Application to the CAS5093 Integrated Circuit", ICECS '96, pp. 168-171.

"Diagnosing On-Card Error Checking and Correcting Operations Using Latched Syndrome Data, IBM Technical Disclosure Bulletin", Oct. 1989, No. NA891026.

"Single-Bit Correct, Double-Bit Error Checking/ Correction Scheme", IBM Technical Disclosure Bulletin, May 1994, No. NN9405101.

Ramesh Pryndiah et al., "Performance of Block Turbo Coded 16—QAM and 64—QAM Modulations", IEEE, 1995, pp. 1039-1043.

Annie Picart et al., "Performance of Turbo-Decoded Product Codes Used in Multilevel Coding", IEEE, 1996, pp. 107-111.

Ramesh Mahendra Pyndiah, "Near-Optimum Decoding of Product Codes: Block Turbo Codes", IEEE, Transaction on Communications, vol. 46, No. 8, Aug. 1998, pp. 1003-1010.

Jung-Fu Cheng et al., "Frequency-Efficient Coding with Low-Density Generator Matrices", 34th Allerton Conference on Communication Control and Computing, Oct. 1996, pp. 1-30.

S. Dolinar et al., "Code Performance as a Function of Block Size", TMO Progress Report 42-133, May 15, 1998, pp. 1-23.

D. Divsalar et al., "Multiple Turbo Codes for Deep-Space Communications", TDA Progress Report 42-121, May 15, 1995, pp. 66-77.

D. Divsalar et al., "Turbo Codes for Deep-Space Communications", TDA Progress Report 42-120, Feb. 15, 1995, pp. 29-39.

D. Divsalar et al., "On the Design of Turbo Codes", TDA Progress Report 42-123, Nov. 15, 1995, pp. 99-121.

Gerard Battail et al., Pseudo-Random Recursive Convolutional Coding for Near-Capacity Performance, IEEE, 1993, pp. 23-27.

Michael Moher, "Decoding via Cross-Entropy Minimization", IEEE, 1993, pp. 809-813.
S. Benedetto et al., "Soft-Output Decoding Algorithms for Continuous Decoding of Parallel Concatented Convolutional Codes", IEEE, 1996, pp. 112-117.
Peter Hoeher, "Advances in Soft-Output Decoding", IEEE, 1993, pp. 793-797.
Claude Berrou et al., "A Low Complexity Soft-Output Viterbi Decoder Architecture", IEEE, 1993, pp. 737-740.
Joachim Hagenauer, "Decoding of Binary Codes with Analog Networks", ITW., Feb. 1998, pp. 13-14.
N. Seshadri et al., "On Post-Decision Symbol-Reliability Generation", IEEE, 1993, pp. 741-745.
Daniel J. Costello, Jr. et al., "The Effect of Turbo Codes on Figure 1", ITW, Feb. 1998, pp. 41-42.
D. Divsalar et al., "Turbo Codes for PCS Applications", Jet Propulsion Laboratory, California Institute of Technology.
C. Berrou et al., "An IC for Turbo-Codes Encoding and Decoding", IEEE, 1995, pp. 90-91.
A.J. Viterbi et al., "Perspectives on Interleaved Concatenated Codes with Iterative Soft-Output Decoding", International Symposium on Turbo Codes, 1997, pp. 47-54.
Charles C. Wang, "Asymptotic Performances of Nonrepetitive and Repetitive Turbo Codes", IEEE, 1997, pp. 1-6.
Andrew Hunt et al., "Hyper-Codes: High-Performance Low-Complexity Error-Correcting Codes", Date Unknown.
Charles C. Wang, "On the Performance of Turbo Codes", IEEE 1998, pp. 987-992.
Sergio Benedetto, "Analysis, Design, and Iterative Decoding of Double Serially Concatenated Codes with Interleavers", IEEE, 1998, pp. 231-244.
Omer F. Acikel et al., "Punctured Turbo Codes for BPSK/QPSK Channels", Mar. 3, 1999, pp. 1-30.
Omer F. Acikel, "Implementation Issues for High Rate Turbo Codes on BPSK/QPSK Channels", Mar. 15, 1999, pp. 1-12.
Joachim Hagenauer, "Iterative Decoding of Binary Block and Convolutional Codes", IEEE, 1996, pp. 429-445.
L. R. Bahl et al., "Optimal Decoding of Linear Codes for Minimizing Symbol Error Rate", IEEE Transactions on Information Theory, Mar. 1974, pp. 284-287.
Peter Elias, "Error-Free Coding", Department of Electrical Engineering and Research Laboratory of Electronics, MIT, pp. 29-37.
Sudhakar M. Reddy, "Random Error and Burst Correction by Iterated Codes", IEEE Transaction on Information Theory, vol. IT-18 No. 1, Jan. 1972, pp. 182-185.
David Chase, "A Class of Algorithms for Decoding Block Codes With Channel Measurement Information", IEEE Transactions on Information Theory, vol. IT-18, No. 1, Jan. 1972, pp. 170-182.
Patrick Adde et al., "Design and Peformance of a Product Code Turbo Encoding-Decoding Prototype", Ann Telecomun., vol. 54, No. 3-4, 1999, pp. 214-219.
Andre Goalic et al., "Real-Time Turbo-Decoding of Product Codes on a Digital Signal Processor", IEEE, 1997, pp. 624-628.
Ludo Tolhuizen et al., "Union Bounds on the Performance of Product Codes", IEEE, 1998, p. 267.
L. Tolhuizen et al., "On the Weight Enumerator of Product Codes", Discrete Mathematics vol. 106, No. 107, 1992, pp. 483-488.
Franco Chiaraluce et al., "On the Asymptotic Performance of Hamming Product Codes", ISCTA 01, Jul. 15-20, 2001, pp. 1-6.
Helmut Nicki et al., "Approaching Shannon's Capacity Limit by 0.27 dB Using Hamming Codes in a 'Turbo'-Decoding Scheme", ISIT, 1997.
J. Lodge et al., "Separable Map 'Filters' For The Decoding Of Product and Concatenated Codes", IEEE, 1993, pp. 1740-1745.
Joachim Hagenauer et al., "A Viterbi Algorithm with Soft-Decision Outputs and it Applications", IEEE, 1989, pp. 1680-1686.
Shigeichi Hirasawa et al., "Modified Product Codes", IEEE Transactions on Information Theory, vol. IT-30, No. 2, Mar. 1984, pp. 299-306.
Gottfried Ungerboeck, "Channel Coding with Multilevel/Phase Signals", IEEE Transactions on Information Theory, vol. IT-28, No. 1, Jan. 1982, pp. 55-67.
Stamatis Cambanis et al., "Finite Sampling Approximations for Non-Band-Limited Signals", IEEE Transactions of Information Theory, vol. IT-28, No. 1, Jan. 1982, p. 67.
Udo Wachsmann et al., "Multilevel Codes: Theoretical Concepts and Practical Design Rules", IEEE Transaction on Information Theory, vol. 45, No. 5, Jul. 1999, pp. 1361-1391.
Giuseppe Caire et al., "Bit-Interleaved Coded Modulation", IEEE Transactions on Information Theory, vol. 44, No. 3, May 1998, pp. 927-946.
Omer F. Acikel et al., "High Rate Turbo Codes for BPSK/QPSK Channels", IEEE, 1998, pp. 422-427.
W.J. Blackert et al., "Turbo Trellis Codes Modulation", Communications Systems Laboratory, University of Virginia.
Joachim Hagenauer et al., "A Virterbi Algorithm with Soft-Decision Outputs and its Applications", IEEE, 1989, pp. 1680-1686.
Claude Berrou et al., "Near Optiumum Error Correcting Coding and Decoding: Turbo-Codes", IEEE Transaction on Communications, vol. 44, No. 10, Oct. 1996, pp. 1261-1271.

* cited by examiner

ENHANCED TURBO PRODUCT CODE DECODER SYSTEM UTILIZING A CODEWORD ORGANIZATION METHOD

RELATED APPLICATION

This application is a continuation application of and claims priority from application Ser. No. 09/826,443, filed Apr. 4, 2001 now abandoned and entitled "ENHANCED TURBO PRODUCT CODE DECODER SYSTEM," which claims priority under 35 U.S.C. 119 (e) of the now abandoned U.S. Provisional Patent Application, Ser. No. 60/194,570 filed Apr. 4, 2000, and entitled "ENHANCED TURBO PRODUCT CODE DECODER SYSTEM". The Provisional Patent Application, Ser. No. 60/194,570 filed Apr. 4, 2000 and entitled "ENHANCED TURBO PRODUCT CODE DECODER SYSTEM" is also hereby incorporated by reference.

BACKGROUND OF THE INVENTION

The present invention relates to an apparatus and method thereof of decoding data, in general, and in particular, and method and apparatus for decoding Enhanced Turbo Product Codes in an efficient Turbo Product Code Decoder System.

When transmitting data using non-binary lower and higher order modulation, a binary turbo product code encoder and decoder is used, along with Gray code mapping and log-likelihood ratio (LLR) computation. This scheme is often called pragmatic coding because it avoids the complex task of constructing a forward error correction code that matches the given channel requirement. Some prior art coding techniques, such as Ungerboeck Trellis Coded Modulation (TCM), require the construction of convolutional codes that are built based on the desired constellation. Such a code could be built, for example, to match an 8-PSK, or phase shift key, modulation. However, the code must be redesigned if the modulation is changed from 8-PSK to 16-PSK, or 16-QAM, known as Quadrature Amplitude Modulation. This makes practical use of such a coding scheme difficult. Other schemes have been developed for block codes such as Block Coded Modulation, but these also suffer the same code redesign issue.

A pragmatic TCM approach was discovered which alleviated these complex design issues by using a standard binary convolutional code mapped to a higher order modulation system. This approach has also been applied to block codes and to Turbo Product Codes (TPCs). A simple Gray code map is used to map the binary bits output from a TPC encoder to a signal constellation. For example, if 16-QAM is chosen as the modulation type, then bits output from the encoder are grouped into words having 4 bits each.

In order to get optimum performance from a TPC decoder, soft decision information is generated from the channel. This is accomplished by computing the log-likelihood ratio (LLR) which gives a confidence (soft decision) value for each bit in each 4 bit word. The optimal LLR is very complex to compute, as it requires the computation of logarithms, Euclidean distance, and exponentials. The general method used in prior art decoders is to pre-compute the value of the LLR for each possible received channel value. The resulting data is then stored in a ROM or other storage medium, and the LLR is calculated using a table lookup from the storage medium. The problems with this method of computation is that it requires a different lookup table for each modulation format that is supported. In addition, the size of the lookup tables becomes very large for very high order modulations, thus requiring large storage mediums.

What is needed is an LLR approximation method and apparatus which takes an expression with a natural logarithm and exponentials and reduces it to a set of linear equations. In addition, what is needed is that the LLR approximation method be simple enough to be implemented in hardware and also be able to determine soft-input values without using a lookup table.

Previous methods of locating synchronization patterns in data being input were to scan the data stream as it passed a point and then start a counter when a synchronization mark was found to indicate when the next mark would be expected. The problems with this method is whenever a false synchronization mark is found, all other synchronization marks are ignored until it is determined that the synchronization mark was in fact false. Whether the mark is false or not is determined by not finding another mark at the expected location.

This problem can be addressed by using larger synchronization marks. However larger marks cause higher overhead for the synchronization modules. In addition, these solutions that increase the size of a synchronization mark suffer in a noisy environment. Another possibility is scanning the datastream at two or more locations so that two or more synchronization marks can be expected at the same time. This is the same as multiplying the length of the synchronization mark by the number of marks that are observed. This is undesirable because all data between the observed points is buffered in RAM and thus takes up space in the RAM. As the length of the synchronization mark increases, the probability that one or more bits in the synchronization mark are incorrect increases.

Thus, what is needed is a method and apparatus that scans the data stream for synchronization marks and uses only one observation point. What is also needed is that the method and apparatus that scans input bit stream by searching for periodic synchronization marks, and when synchronized, the output data stream is bit and block aligned.

Prior art iterative decoders use a single microprocessor to execute the steps required to decode data entering the system. These decoders are relatively slow, because the data is stored in the system's memory. Hardware implementations of turbo decoders generally use a serial concatenation of SISO decoders to achieve faster decoding speeds, with each SISO performing one iteration and passing the data to succeeding SISOs to do later iterations. Such decoders increase the latency of the system and also require more logic to implement.

Some prior art decoders utilize parallel processing to achieve higher data throughput rates. These types of decoders store data with four codeword bits per RAM location. The data is then accessed and sent directly to four parallel SISO decoders, where each decoder can input only one codeword bit per clock cycle. These decoders have a data throughput that is 4 times more than decoders using only one SISO. Thus, the processing power grows linearly with the parallel SISOs. For example, if a decoder uses 8 SISOs instead of 4, it will operate at roughly twice the speed. If a decoder operating at 100 Mbit/sec or even 1 Gbit/sec is required, this method of decoding will become too complex to build. Further, prior art decoders cannot support Enhanced TPCs (ETPCs), which are codes that include constituent coding, such as extending Hamming Codes and/or parity codes along with hyper diagonal parity. Also, prior art SISO decoders input generally one codeword bit per clock cycle. So, the SISO executes the decoding steps as the data is received and after the entire codeword is input into the SISO. The SISO then outputs the result one codeword bit per clock cycle.

Instead, what is needed is a SISO decoder that can process multiple codeword bits per clock cycle. Therefore, what is needed is a decoding method and apparatus that can process data in parallel and scale to higher decoding throughput rates. What is also needed is that the method and apparatus support scalable decoding as well as able to decode ETPCs. What is also needed is a RAM organization method in the apparatus which results in low complexity, high data throughput RAM access.

Prior art decoders find codewords nearby the center codeword. The prior art decoders utilize a search algorithm that requires a used bit location register, syndrome calculations, and error lookup tables to find the nearby codewords. Using these algorithms and registers, the decoder requires a significant amount of hardware. This hardware includes large syndrome generating circuits that are slow due to the significant amount of syndrome calculations. In addition, used bit location registers and lookup tables are required which add to the amount of hardware. What is needed is a method and apparatus to calculate nearest neighbor codewords in reduced search set. What is also needed is that the method and apparatus simplify the nearest neighbor search and reduce the codeword search by using much less logic than that of the prior art.

The number of iterations required to correct a block of data varies from block to block. This phenomenon occurs even when the channel conditions have white Gaussian noise. The location and number of errors created by the channel can change the rate at which the decoder converges. FIG. 1 shows a probability density function of the iterations. The x-axis if FIG. 1 shows the number of iterations ranging from 1 to 30. The y-axis shows the probability of a given block requiring that number of iterations. As can be seen, there is a long tail extending out to 20 iterations. In fact, for this set of blocks, the maximum number of iterations required is 26.

When an iterative decoder is required to run at a maximum number of iterations, all blocks of data that do not converge are output from the decoder with errors. This causes results in poor bit error rate performance, because the decoder is not allowed to iterate longer on the blocks of data to correct these errors. The prior art decoder has the ability to stop iterating once it converges on the block of data. However, the decoder will have problems converging on a block of data which enters as a continuous stream. In other words, it is very difficult to stop the transmission of data when the decoder requires a larger number of iterations to converge.

What is needed is a decoder that is able to determine when it has converged on a codeword. What is also needed is a decoder which iterates more for more difficult blocks and iterates less for less difficult blocks. What is also needed is a decoder that can converge on blocks of data that are input into the decoder in a continuous stream. It is also desired that the decoder utilize a design that allows it to run a variable number of iterations.

SUMMARY OF THE INVENTION

A method and apparatus for decoding a linear block encoded string of information bits comprising: converting the string into a plurality of codewords. Performing hard and soft decisions on each codeword to generate a hard and soft decision vector. Computing the syndrome and finding the location of the two minimum values by Galois Field Arithmetic. Designating these values LOW1 and LOW2 and xoring with a Nc1, thus generating Nc2. Swapping Nc1 with Nc2 and determining the lowest soft decision value, Min1 and a next lowest value, Min2. The two bit locations creating Min1 are designated as MinA and MinB. MinA being replaced with Min2 minus the value MinA. MinB being replaced with Min2 minus the value at MinB. Generating an output codeword by subtracting Min1 from all other bit locations values and 2's complementing all soft values with 0 in their location. Creating the new soft value vector.

Other features and advantages of the present invention will become apparent after reviewing the detailed description of the preferred embodiments set forth below.

DETAILED DESCRIPTION OF THE PREFERRED EMBODIMENT

The present invention is to an enhanced Turbo Product Code (ETPC) Forward Error Correction (FEC) Encoder/Decoder System or Device. The system in accordance with the present invention supports single or multi-dimensional codes having both extended-Hamming and parity only constituent codes. This device may integrate both an ETPC encoder and decoder as well as modules for helical interleaving, synchronization mark insertion and detection, CRC computation, scrambling, and higher order modulation symbol mapping.

Figure 1:
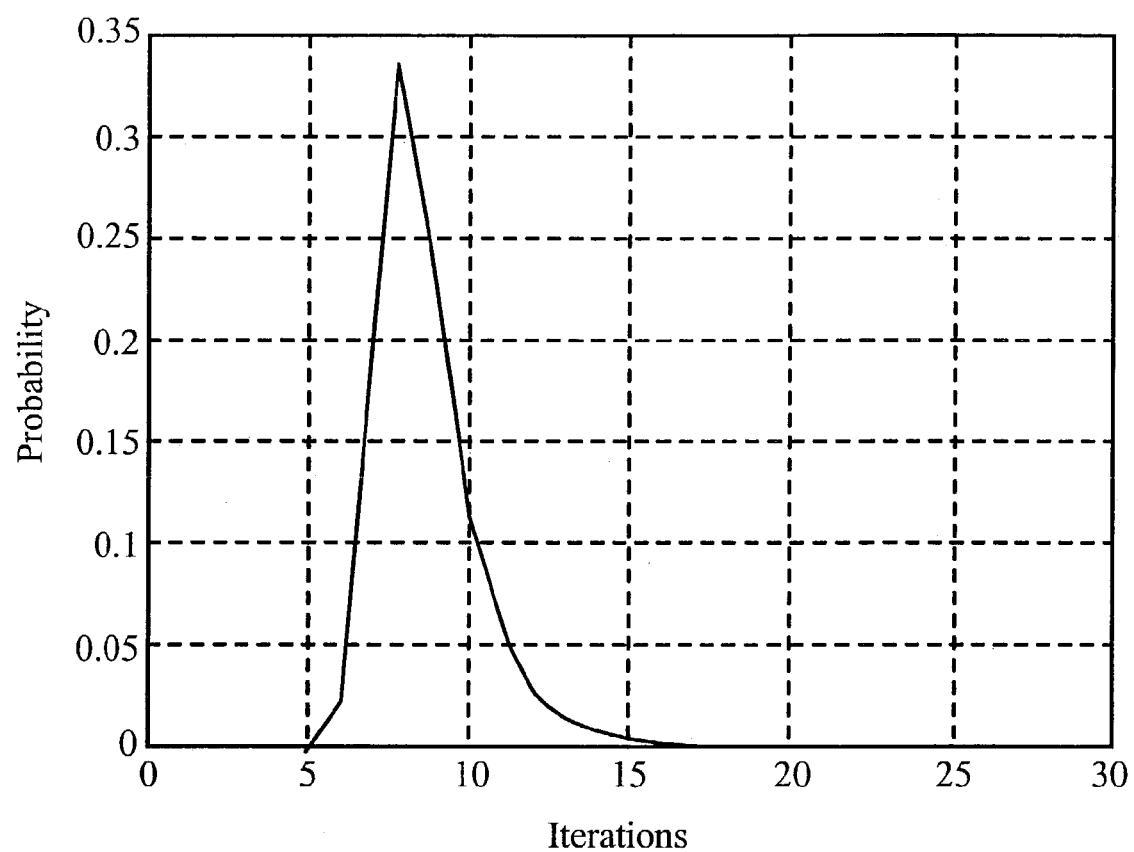
FIG. 1 illustrates a plot of the probability that a decoder will need a certain number of iterations based on the number of iterations.
Figure 2:
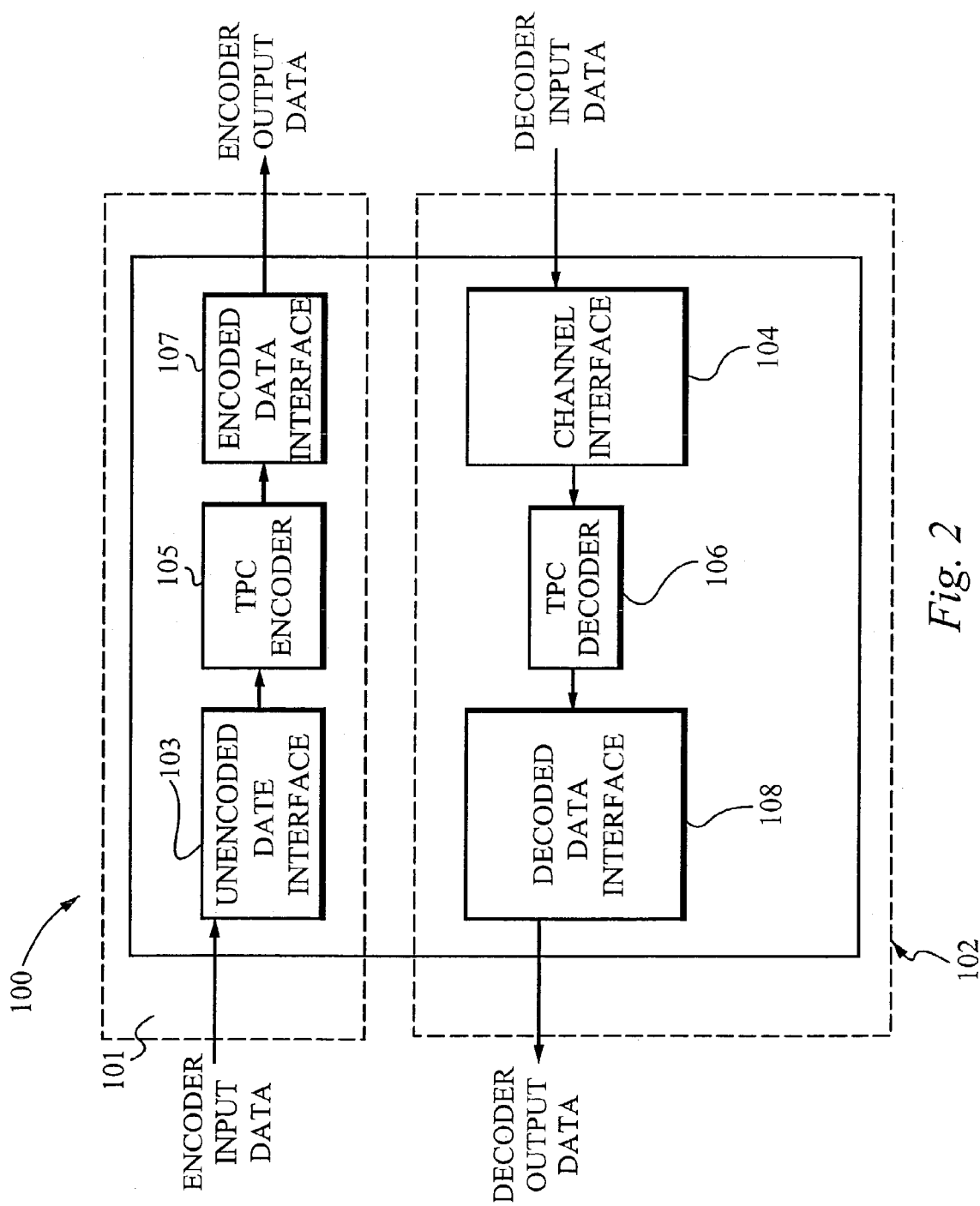
FIG. 2 illustrates a block diagram of encoder/decoder system in accordance with the present invention.

FIG. 2 shows a block diagram of the system in accordance with the present invention. The encoder path 101 of the device includes an unencoded data interface 103, an encoder module 105, and an encoded data interface 107. The decoder path 102 of the device 100 includes a channel interface 104, a decoder module 106 and a decoded data interface 108. Each module in the decoding path 102 of the present system 100 preferably serves as a counterpart for each module in the encoding path 101. The encoder 101 and decoder 102 are isolated paths which preferably allows full duplex operation, where the encoder and decoder are operating with different frame structures, code types, and data rates.

The system's 100 encoding path 101 accepts byte-wide data, computes and inserts a Cyclic Redundancy Check (CRC) and scrambles the data before ETPC encoding. After the error correction code (ECC) bits are inserted by the encoding path 101 into the decoding path 102, the data is helically interleaved and block synchronization marks are inserted to assist the decoder 106. Finally, the data is mapped according to the constellation and output from the device 100.

Helical interleaving transmits data in a helical fashion. When the channel introduces a burst of errors, the helical deinterleaver in the decoding path 102 will spread these errors across all axes of the code. The use of helical interleaving greatly increases the burst error correcting capability of the code. Helical interleaving is applied along a diagonal path through the encoded block. Data is output along diagonal lines from the upper left to lower right corner (for a 2D code). For example, the first diagonal output starts with the bit row 1, column 1 followed by the diagonal starting at row 1, column 2. For 3D codes, instead of reading diagonally through the 2D array, interleaving reads diagonally through a cube of data. 3D interleaving/deinterleaving is done by reading/writing cells diagonally through the x, y, and z dimensions.

In general, the decoding path 102 accepts input symbols via the demodulated in-phase (I) and quadrature (Q) components. An internal block synchronizer (not shown) searches for synchronization marks, rotating the input symbol phase as necessary. After synchronization is achieved, the data is helically deinterleaved and decoded by the ETPC decoder 102. The output of the decoder 102 is descrambled by the decoded data interface 108, and the CRC is computed to verify data integrity.

In order for the decoder 102 in the present system to synchronize the block of data, a programmable synchronization or "sync" mark is inserted into the data stream before transmission over the channel. Synchronization marks are preferably placed at the beginning of each ETPC block and placed throughout the block, with inverted sync marks placed at the beginning of each ETPC block. This accelerates the synchronization process when the decoder uses large ETPC block sizes or the decoder is in low signal to noise ratio environments. More detail of the sync marks will be discussed later.

Figure 3:
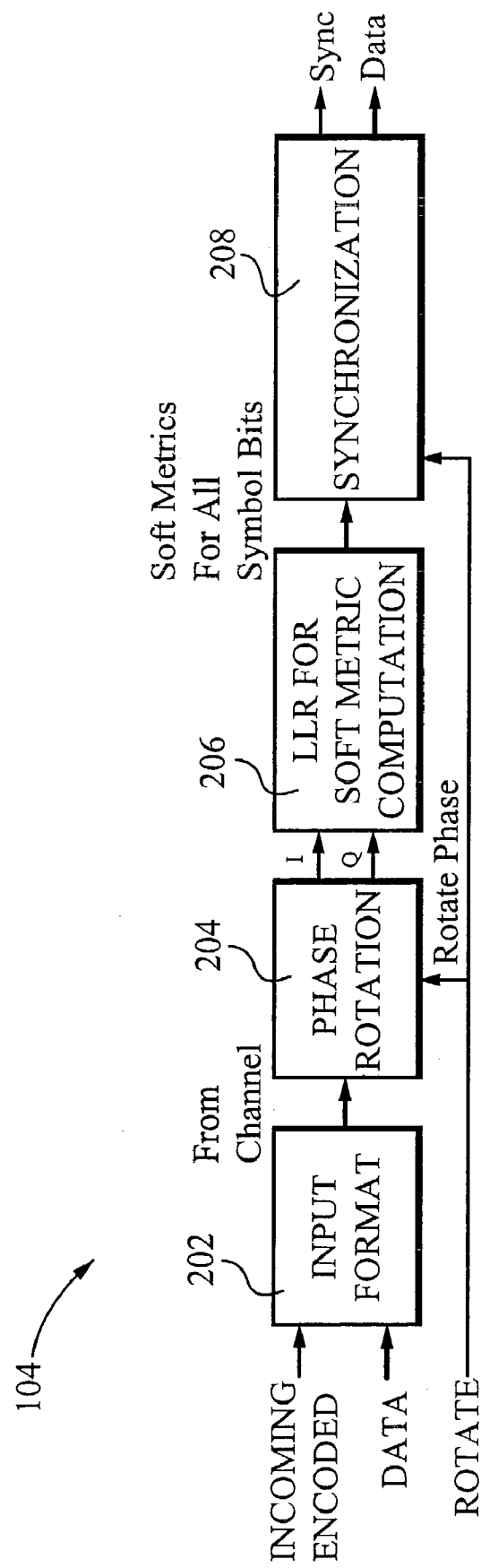
FIG. 3 illustrates a block diagram of the channel interface module in accordance with the present invention.

FIG. 3 shows a block diagram of the channel interface 104 in accordance with the present invention. The channel interface is broken up into four modules which perform the functions of: channel input formatting 202, input symbol rotation 204, soft metric computation 206, and synchronization 208. The channel interface 104 in the present invention formats the channel data for the decoder. For best decoder performance, soft (confidence) information from the channel is preferably included. When using BPSK/QPSK, this information comes directly from the in-phase (I) or quadrature (Q) component of the received symbol. However, when using higher-order modulations, the soft metrics for each bit in the constellation is computed. This is accomplished using the Log-Likelihood Ratio (LLR) which is discussed below. In addition to soft metric generation, the ETPC decoder 106 generally knows the location of the first bit of a ETPC block. This is accomplished in the channel interface 104 by searching through the input bit stream for the predefined synchronization marks. The channel interface 104 is designed to connect directly to the in-phase and quadrature (I & Q) outputs of a demodulator for internal soft metric computation. These inputs can be digitized, either with the use of a digital demodulator, or by an external Analog to Digital (A/D) Convertor. Alternately, metric computation can be done externally, in which case the internal computation is bypassed.

The encoded data sent into the data input module 202 may be received in a bursty fashion. Thus, the device 100 of the present invention preferably contains internal buffering to allow continuous data input and output for both encoding and decoding. The relationship between the number of transfers input into the decoder 106 relative to the number of transfers output from the decoder 106 is dependent on the user packet size, ETPC code rate, sync mark size, user packet size, CRC, pad bits, symbol size as well as other factors. In order for the device 100 of the present invention to determine the rate at which data is to be input and/or output, the ratio of the overall input vs. output transfer rates may be programmed into the device 100. This ratio takes into account all data inserted and/or removed in the data stream as well as the symbol size of the data.

The Phase Rotation Module 202 in the present invention solves the problem of a phase ambiguity by rotating the phase of the input symbols. The input symbols are rotated to the correct phase before being decoded. The system 100 uses the following algorithm to determine phase rotation: 1) Attempt synchronization with 0 degree rotation. 2) If synchronization is detected with this phase rotation, immediately begin decoding. 3) Wait the amount of time in which the synchronizer 208 would achieve synchronization, and rotate the phase by one step if there is no synchronization detected. 4) Repeat steps 2 & 3 until synchronization is achieved. After synchronization occurs, the current phase rotation of the incoming stream can be read. The phase rotation can be done by external logic. In addition, the synchronizer 208 can be configured to automatically synchronize the input data to an inverted bit stream.

Log Likelihood Ratio Approximation

The Log Likelihood Ratio (LLR) approximation module 206 provides a linear approximation of the actual LLR of an 8-PSK, 16-Quadrature Amplitude Modulation (QAM), 64-QAM, 256-QAM and other higher order modulations. As the signal to noise ratio increases, the approximation of the LLR comes closer to the actual value of the LLR. The actual LLR expressions do not appear linear, however plots of the LLR show regions of high linearity. The general shape or slope of each LLR is approximated by the use of linear equations of the form $y=a(x-b)$ where a and b are constants and x is an independent variable. Accurate values of a and b are determined from the actual LLR equations. These values are determined by taking the derivative of the actual LLR and evaluating specific points of interest within the linear regions the LLR shape.

Data out of the ETPC encoding path 101 is grouped into "m" bits, where "m" is the number of bits per symbol. This group of bits entering the encoded data interface 107 is mapped as a symbol and transmitted over the channel. When bits are grouped before being mapped, the first bit of the block is preferably the least significant bit or LSB of the constellation symbol, whereas the m'th bit of the group is preferably the MSB of the constellation symbol. After the constellation is de-rotated, the device 100 converts the input symbol I & Q into a set of soft metric values.

LLR approximation can be used to generate soft-input values for soft-decision decoding. In order to determine those values, the LLR is computed for a given constellation. When computing the LLR of a block of data, the positions of each constellation point is input in terms of the input quantization range as well as the phase rotation. The LLR module of the present invention takes a (I,Q) symbol point in the I-Q plane with a given constellation and calculates the LLR for each bit of the symbol points. Data is accepted in (I,Q) pairs and the output is calculated in $(b_{n-1}, \ldots, b_0)$ n-tuples where n is determined by the chosen constellation. The LLR output includes a SOFT_BITS value of resolution for each bit of the symbol.

The LLR approximation method of the present invention utilizes constants which are derived from linear equations based on the SOFT_BITS values. The linear equations are determined by examining the individual slopes of the actual LLR. Each slope is determined in the I and Q directions by taking the partial derivative with respect to the direction of the slope. In certain regions, the slope may be zero in one direction, whereas in other regions, the slope may have two slopes in two directions. By taking the partial derivative of the slope in a region and evaluating the derivative at points of interest within the region, the slope may be determined.

Figure 4A:
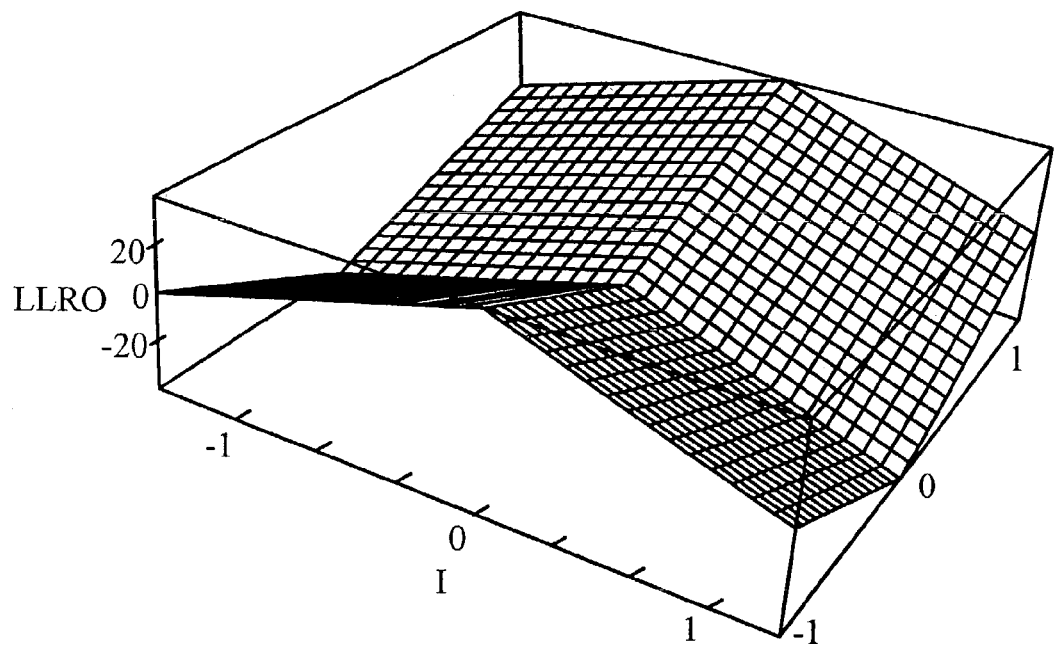
FIGS. 4a, 4b, and 4c illustrate three dimensional graphs of Log Likelihood Ratio Plots.
Figure 4B:
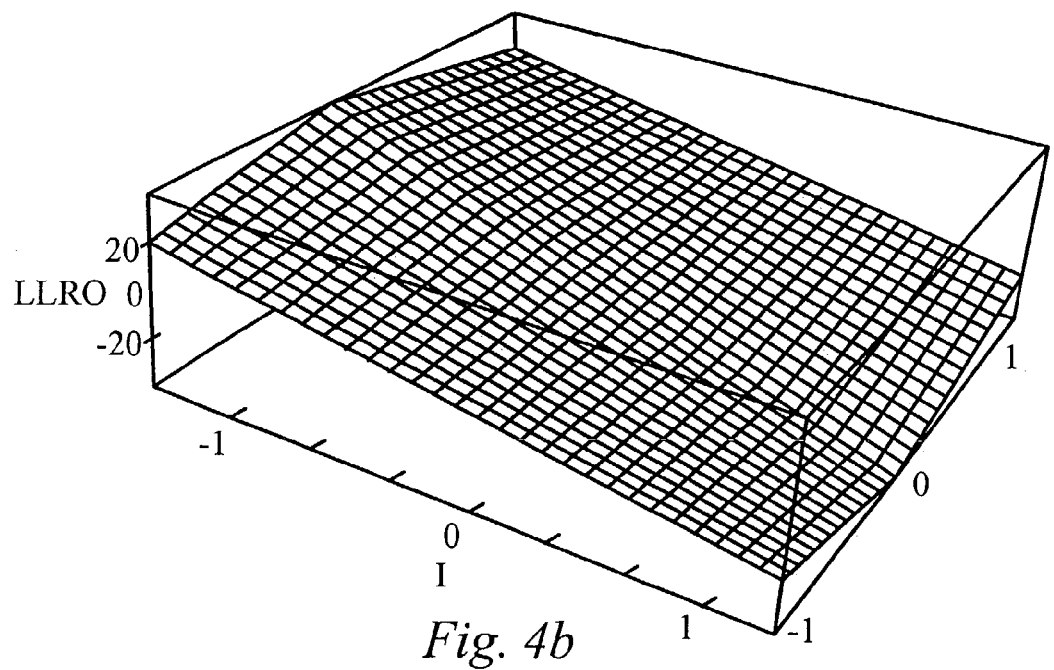
Figure 4C:
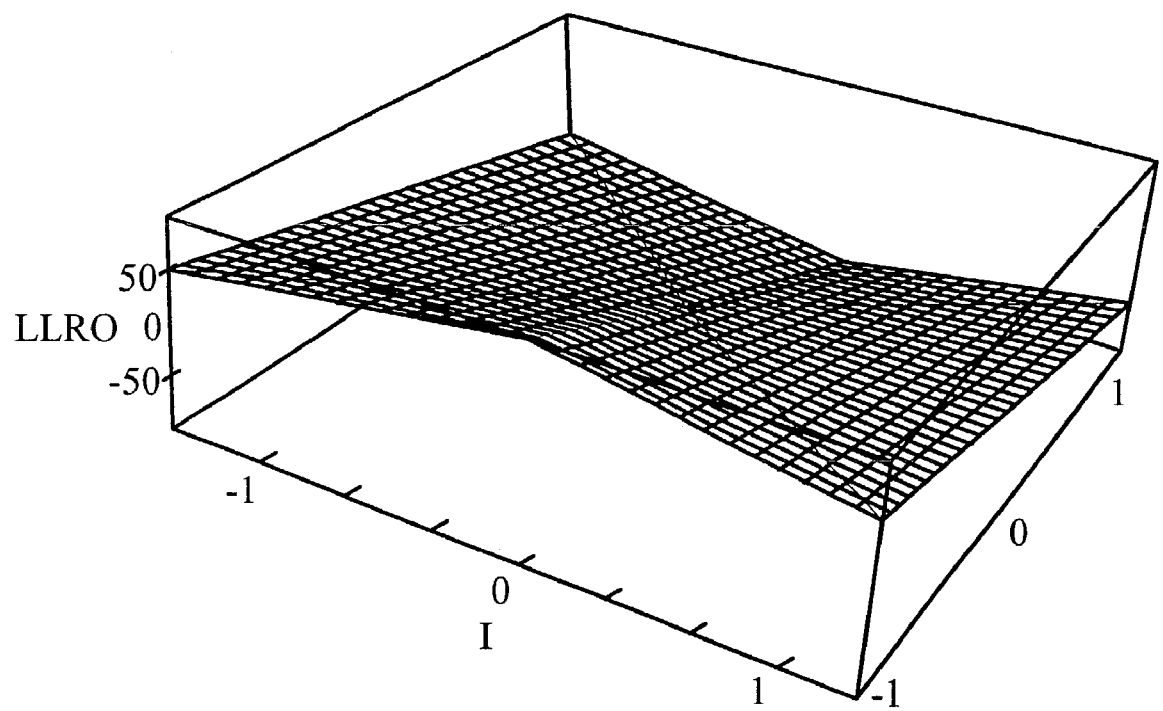

FIGS. 4(a–c) illustrate the plots for each bit of an 8_PSK constellation. FIG. 4a shows a LLR plot of bit 0, FIG. 4b shows the LLR plot of bit 1 an FIG. 4c shows the LLR plot of bit 2. In FIG. 4a, the slope is the same for all constellation points. The LLR graph for bit 1 has the same shape as that of bit 0 and both are images about the line I=Q. Thus, by using one set of equations and swapping the I and Q values, both LLRs can be determined. Also, the pointed regions of the LLR have the same shape. So, only two constants are used to evaluate the LLRs for bit 0 and bit 1.

The first constant is determined by taking the derivative within the flat, down sloped region of the graph, where the absolute value of I is less than the absolute value of Q. In this region, the slope in the Q direction is zero. Thus, only the partial value with respect to I needs to be evaluated. Thus a constant may be determined if the LLR is evaluated taking the slope at any point along the line I=Q which is sufficiently far away from the origin. The second constant is determined by taking the derivative within the pointed region. The value of the derivative in each direction is different only by their sign. Hence, using either slope will produce the constant, because the sign of the result can be ignored.

However, the constants are dependent on the signal to noise ratio (SNR) of the channel. The present invention quantizes the results of the LLR and saturates the LLR results to an independent value. Concerning quantization, there are a certain number of resolution bits or SOFT_BITS available to express a large range of numbers. To quantize the result, the fist step is to multiply the LLR result with an equation which is not dependent on the SNR. In particular, the equation is shown below:

$$\text{Quantize} = \left( LLR \frac{2^{\text{SOFT\_BITS}-1}}{qLIMIT} + 2^{\text{SOFT\_BITS}-1} \right) \quad (1)$$

where SOFT_BITS is the number or value of resolution of bits and qLIMIT is the saturation limit which is a constant defined by the type of modulation. The above equation is still dependent on the SNR, because the resolution of bits is affected by the amount of noise over the channel. However, if qLIMIT is chosen appropriately to also be dependent on the SNR, each variable's dependence on the SNR will cancel each other variable's dependence out. Thus, the above equation will become independent of the SNR at high SNR values.

The qLIMIT value should be chosen to be the peak value of the smallest LLR value, qLIMIT will become dependent on the SNR. As the SNR increases, the quantization of the LLR becomes constant around the 8–10 dB range and continues to be constant above the 10 dB range. Further, if the actual channel SNR stays high enough, the LLR will remain accurate.

Figure 5:
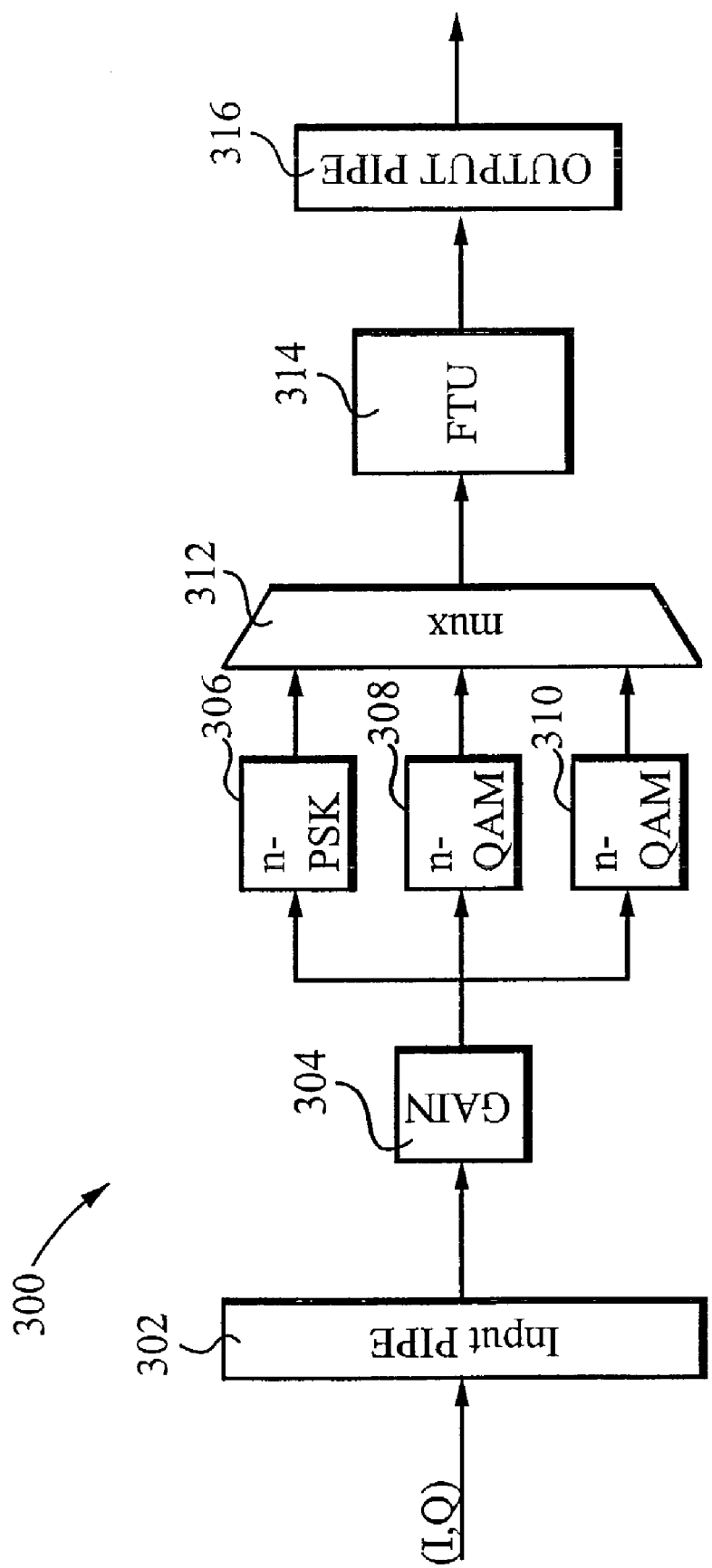
FIG. 5 illustrates a block diagram of the Log Likelihood Ratio module in accordance with the present invention.

FIG. 5 shows a block diagram of the LLR module 206 in accordance with the present invention. The LLR module 206 includes an input pipe 302, a gain module 304, a PSK module 306, two QAM modules 308 and 310, a multiplexer 312, a Floating to Unsigned (FTU) converter 314 and an output pipe 316. The input pipe 302 receives the data as (I,Q) symbols and the gain module 304 scales the symbols by a multiplicative factor. The PSK module 306 and the QAM modules 308 and 310 receive a modulation signal which determines the modulation scheme in calculating the LLR of the data. The PSK module 306 computes the LLR of an I-Q pair by implementing the LLR equations for the LLR approximation. As shown in FIG. 5, the LLR module has two QAM modules 308 and 310, each of which computes the LLR for all the bits in parallel. Preferably, the QAM modules 308 and 310 compute the LLR of half of the bits and feeds the LLR values into the multiplexer 312 as a LLR result. The FTU converter 314 takes the result of the LLR from the multiplexer 312 and converts it into an unsigned number. The FTU converter 314 preferably converts the LLR result into the unsigned values, which are determined from the SOFT_BITS value.

In addition, the quantization discussed above is preferably done in a quantization circuit which does not need to multiply any values, but only saturates and rounds the values. In addition, use of the quantization method is advantageous, because the constants are already defined in the hardware and do not have to be programmed.

When using higher order modulation, such as mQAM and mPSK, the number of bits per symbol is b=log2(m). If the x axis length of the code, not helically interleaved, is a multiple of b, then the least significant bits (LSB) of the constellation symbol will be mapped as the same columns of the ETPC block. Likewise, if the y axis, for 2-D, is interleaved, or z axis for, 3-D, is interleaved, and is a multiple of b, then the LSB of the constellation symbol will be mapped as the same columns of the ETPC block. In order to improve the performance of the code in these situations, the bits that form each symbol are rotated by the modulus equation, x mod b, where x is the row that contains the symbol. When using 2-D interleaved code, the bits that form each symbol are rotated by y mod b and when using 3-D, z mod b. For example, the first row of a non-interleaved code contains no rotation. The second row is rotated by 1 bit, the third row by 2 bits, etc. The b'th row does not get rotated.

The rotate function is used to shuffle bits from modulation symbols to make sure that all low confidence bits in the symbol do not end up in the same ETPC block column or plane. In the present invention, a simplified version based on a nibble wide rotate is executed on succeeding rows to spread these low confidence bits across the columns. When the data bits enter the rotating module, the first row input to the decoder 106 preferably has no rotation. Preferably, the second row has all nibbles rotated left by 1. The third row has all nibbles is preferably rotated left by 2, etc. In 3-D codes, the first row of the second plane is preferably rotated left by 1. Then the next row is preferably rotated left by 2, etc. Since a row is not guaranteed to be a multiple of 4 bits, the last nibble of the row will contain data from the next row. This last nibble is rotated the same as the rest in the first row, and the following nibble is rotated according to the rotation of the next row. This rotation is reset at the beginning of every ETPC block.

Synchronization

The device 100 of the present invention utilizes bit and block level synchronization that tracks multiple synchronization possibilities at once. The device 100 also uses a synchronization first in-first out (FIFO) RAM or queue for scanning a data stream of synchronization marks that uses any one observation point. The device 100 preferably stores the information for each synchronization possibility, called a synchronization thread, and does not store the data between synchronization marks. When a synchronization mark is located, a synchronization thread is created and stored in the queue. The thread includes a thread time, which is an n bit unsigned number that refers to the time on a bit counter, and a thread count value that indicates the number of synchronization marks found on this thread. The synchronization module 208 synchronizes the input data by searching for periodic synchronization marks. When synchronized, the output data stream is aligned with the input data. A lock threshold value may be programmed which signals the synchronizer 208 to lock when the lock threshold value is reached. In addition, a good sync threshold may be programmed which informs the synchronizer 208 how many bits are needed for a sync mark to be a good sync mark. The first thread with a thread count greater than a threshold is used for synchronization. When the good sync threshold value has been reached, the synchronization module 208 signals the first transfer of each synchronized block of data. The synchronizer 208 continues to look for synchronization marks as the data is input into the synchronization module and adds a new thread for each mark found until the thread count value equals the thread time on top of the queue. The thread is popped off the queue when the thread count value equals the thread time. If a synchronization mark is found at the thread time, the thread count is incremented and the thread is pushed back on the queue.

All synchronization is preferably done in the synchronizer 208 at the bit level after mapping from symbols to soft metrics. Inverted synchronization marks are placed at the start of an ETPC block, and non-inverted marks may be distributed throughout the block of data to decrease the synchronization time. The synchronizer 208 preferably looks at multiple points in the data stream, separated by the period between the synchronization marks. The synchronizer 208 preferably uses a frame synchronization mark to determine where sync marks are expected. The synchronizer module 208 determines how many bits in a sync mark can be incorrect but still render the sync mark as valid. The synchronizer 208 can also attempt to synchronize the data stream into an inverted bit stream. If synchronization is acquired on an inverted stream, the synchronizer inverts all the data bits.

When synchronized, the device 100 preferably detects loss of synchronization two ways. One way is by an up/down counter monitors the synchronization marks coming over the channel, which is incremented for each invalid mark and decremented for each valid mark. If a loss of synchronization is assumed, a resynchronization is executed.

In addition, the synchronizer detect loss of synchronization by keeping a count of consecutive failed blocks. If this count equals the synchronization loss threshold, a loss of synchronization is assumed, and a resynchronization is executed. When a resynchronization occurs, preferably all the data in the decoding path 102 is discarded and the internal frame synchronizer is disabled. Further, any bits inserted beyond the end of the ETPC block and the beginning of the next frame are discarded by the device 100. The beginning of each frame is preferably aligned with the transfer of data bits. To align the frame with the transfer, padding may be added if the frame is not a multiple of the bits per symbol. In addition, if no further data is input into the device 100, it is preferred that 8 additional bits be input into the device to allow the previous block to be decoded and output. These bits may automatically be discarded by the device 100.

The synchronizer 208 maintains a system bit time or bit time which is used to time all expected events. The bit_time is simply a counter that increments once for each bit input into the synchronizer 208 and is reset when it reaches a programmable sync period. The sync period is the number of bits between the start of consecutive sync marks. Each bit position in the input stream receives a score that represents the number of bits at that position and the proceeding number of bits that were in error. The synchronizer 208 may give a certain score if no errors were found or a different score if an inverted mark is found. If the score is less than or equal to the bit lock threshold, a synchronization thread is created. The synchronizer sets the bit time to the current bit_time plus the expected distance between the valid or good sync marks. The new bit time represents when the next synchronization mark in the thread is expected. If the mark is normal, the normal count is set to one and inverted to zero, and the corresponding thread is pushed into the FIFO structure.

The bit_time of the thread on top of the FIFO is then compared to the system bit_time. If these two values are equal, the thread is popped off the FIFO. If a mark is found at this bit time, the normal or inverted count is incremented, depending on the mark found. If no mark is found, the greater of the normal or inverted count is decremented. If either of these counts are greater than 0, the thread is pushed back to the FIFO, otherwise the thread is dropped. It is also preferred that the thread inversion is checked after the synchronization lock threshold is met.

The synchronization queue may be limited to one pull and one push per clock to allow more than 1 bit of input data per clock. Preferably, if the synchronization block 208 is receiving N bits per clock, the synchronizer 208 will push the best possible synchronization marks that are N bits apart into the queue. Otherwise, it is possible for two threads pushed into the queue on consecutive clocks to require processing on the same clock.

In bypass mode, all input data passed through the synchronization module 208 is unchanged. A signal may be used to mark the start of each block, whereby the signal is registered along with the data through the block. When synchronization is achieved, a synchronization signal is preferably asserted and the data is output from the synchronizer 208.

The thread search algorithm will now be discussed. When a synchronization mark is found, a thread is created that tracks the time the next mark is expected, the type and number of each mark that has been found and whether the thread is an inverted bit stream. The inverted bit is set to 0 for a new thread which is stored in the thread queue. If a mark is found, the appropriate mark counter is incremented, either as inverted or not. The thread time is set again and the thread is stored. If a mark is not found, the non-inverted mark counter is decremented if it is greater than 0.

Preferably, as the thread is stored, it is examined for inversion. The thread is considered inverted if the inverted count is greater than the non_inverted count and the sum of the two counts is greater than 2. If the inversion input is high, the normal/inverted counts are swapped and the inverted bit is set. If the inversion input is low, the thread is removed. If the normal mark count plus inverted mark count is greater or equal to the number of sync marks that accumulate in the thread counter before the thread is accepted, the thread is considered the synchronized stream.

To achieve the constant throughput of data through the system 100, a register based FIFO and a RAM based FIFO may be used. The system 100 preferably decides if a push goes into the RAM or the FIFO registers. After reset, the push will fill the register block and then start filling the RAM. All pops are preferably from the register FIFO, and if the register FIFO is empty, the empty output will be high. The system 100 preferably monitors the state of the register FIFO and issues reads to the RAM in order to keep some data in the register FIFO as long as the RAM is not empty. Because of the delay in RAM reads, this system 100 can issue many RAM reads before the first data is available. Thus, it is preferred that the system 100 monitor the queue pops to know how many RAM read can safely fit within the register FIFO.

RAM Organization Method

The RAM organization method utilized by the system 100 is designed to offer high bandwidth access to the ETPC block stored in the RAM with the ability to access the data on multiple axes. The ETPC may constructed of extended hamming codes and/or other codes and the order of the data should be maintained. Each soft in/soft out (SISO) decoder 410 of the present device may require more than 1 bit of data per clock. The ETPC decoder system 100 may have more than one SISO 410 in parallel, whereby each SISO 410 is capable of receiving multiple data points on each clock. The data points sent to the SISOs trace a code vector through the product code block, and the code vectors are iterated across multiple axis through the ETPC block. The RAM organization method preferably supports transfer per clock read and writes of "s" code word segments, where each word segment is d data bits in length along multiple axes.

The decoder 106 preferably processes a total of s×d codeword bits per clock cycle. Each SISO 410 can preferably receive and consecutively output d bits of a codeword where there are a total of s parallel SISOs 410. Increasing the value of s increases the data rate by simply using parallel processing. For instance, doubling the value of s doubles the number of parallel SISOs 410. Also, increasing the value of d increases the rate that each SISO 410 can process data. For instance, doubling the number of d bits doubles the number of bits each SISO 410 can process per clock. Both s and d values are variable which results in flexibility to achieve a desired decoding rate. In addition, increasing both s and d results in a squaring of the decoding data rate, allowing the decoder 106 to achieve very high data decoding rates.

The ETPC block is preferably distributed among multiple physical RAMs. A unique address is generated for each RAM, where a RAM word is read from all RAMs and assembled to present the logical word required by the decoder 106. Preferably, each RAM can only be accessed once to complete a read or write cycle. The number of physical RAMs required varies dependent on the values of s and d as well as the number of axis that should be supported, and the size of each RAM may vary. Each combination of s and d as well as the axis support may have a unique solution.

For example, a 3D code having 4×4×2, where s=2, d=2, is shown below:

| plane 0 | | | | plane 1 | | | |
|---|---|---|---|---|---|---|---|
| 0 | 1 | 2 | 3 | 16 | 17 | 18 | 19 |
| 4 | 5 | 6 | 7 | 20 | 21 | 22 | 23 |
| 8 | 9 | 10 | 11 | 24 | 25 | 26 | 27 |
| 12 | 13 | 14 | 15 | 28 | 29 | 30 | 31 |

The physical RAM in accordance with the present invention would preferably hold 2 codeword bits per word. Plane 0 above would therefore may be sent into the RAM as:

| A0 | A1 |
|---|---|
| B0 | B1 |
| A2 | A3 |
| B2 | B3 | where A or B represents the RAM name and the number is the physical RAM address. The present invention in this example would thus have A0 contain the codeword bits:

| 0 | 1 |
|---|---| where both data points are kept within A0.

For all axes of the above example, the system 100 preferably requires 2 physical RAMs, each holding one data point. Data from plane 0 and plane 1 are mapped into the RAMs shown below.

| Plane 0 | | | | Plane 1 | | | |
|---|---|---|---|---|---|---|---|
| A0 | A0 | A1 | A1 | B4 | B4 | B5 | B5 |
| B0 | B0 | B1 | B1 | A4 | A4 | A5 | A5 |
| A2 | A2 | A3 | A3 | B6 | B6 | B7 | B7 |
| B2 | B2 | B3 | B3 | A6 | A6 | A7 | A7 |

This RAM organization method allows data to be accessed equally on all. This will allow the system 100 to utilize the same SISO decoders 410 to decode any axis of the code, and it will enable maximum decoder efficiency by keeping all SISOs 410 busy independent of the axis being decoded. To illustrate this, the decoding of each of the three code axes will be described below.

The decoder in this example uses s=2 SISOs, where each SISO can accept d=2 codeword bits per clock cycle. Therefore, the RAM organization method preferably is such that on a given clock cycle, each RAM can be read only once, reading all data required by the SISOs 410 on that clock cycle. The RAM organization described above for a 3-D code will also accomplish this result.

In order to decode the x-axis, the first two rows of the codewords in plane 0 will be input consecutively into the 2 SISOs 410 by inputting 2 codeword bits per clock into each SISO 410. Once these two rows are completed, the last two rows of plane 0 are input. Then, the first two rows of plane 1 and finally the last two rows of plane 1 are input to the SISOs. In order to accomplish this, the following RAM access occurs, as shown in Table 1.

TABLE 1

| Clock Cycle Number | RAM Access | Rows Input |
|---|---|---|
| 1 | Read A0 and B0 | Rows 0 and 1 of plane 0 |
| 2 | Read A1 and B1 | |
| 3 | Read A2 and B2 | Rows 2 and 3 of plane 0 |
| 4 | Read A3 and B3 | |
| 5 | Read A4 and B4 | Rows 1 and 2 of plane 1 |
| 6 | Read A5 and B5 | |
| 7 | Read A6 and B6 | Rows 3 and 4 of plane 1 |
| 8 | Read A7 and B7 | |

The RAM access in the above table reads all the data from the code block at two rows at a time and four total codeword bits per clock cycle. As the RAM is being read, the data is then input into the two SISO decoders 106. When RAM location A0 is read, the two codeword bits from that RAM location are input into a single SISO 410. Similarly, when location B0 is read, the two codeword bits from the B0 location are input into the other SISO 410.

To decode the y-axis, the first two columns of the codeword in plane 0 will be input consecutively into the 2 SISOs 410 by inputting 2 codeword bits per clock into each SISO 410. Once these two columns are completed, the last two rows of plane 0 are input. Then, the first two columns of plane 1 and finally the two last columns of plane 1 are input to the SISOs 410. In order to accomplish this, the following RAM access occurs, as shown in Table 2.

TABLE 2

| Clock Cycle Number | RAM Access | Columns Input |
|---|---|---|
| 1 | Read A0 and B0 | Columns 0 and 1 of plane 0 |
| 2 | Read A2 and B2 | |
| 3 | Read A1 and B1 | Columns 2 and 3 of plane 0 |
| 4 | Read A3 and B3 | |
| 5 | Read B4 and A4 | Columns 1 and 2 of plane 1 |
| 6 | Read B6 and A6 | |
| 7 | Read B5 and A5 | Columns 3 and 4 of plane 1 |
| 8 | Read B7 and A7 | |

The RAM access reads all data from the code block at two columns at a time and four total codeword bits per clock cycle. The RAM access then inputs the data into the two SISO decoders 106. This case differs from that in Table 1, because the data sent to the first SISO 410 on the first clock is composed of one of the codeword bits read from location A0 and one codeword bit read from location B0. Similarly, the data sent to the second SISO 410 on the first clock is the other codeword bit read from location A0 and the other codeword read from location B0. Using this method, the SISOs 410 are ecoding the columns of the code block instead of the rows.

Finally, in order to decode planes or the z-axis in a 3-D block, the first two z-column codewords of the array will be input consecutively into the 2 SISOs 410 on the first clock cycle. Since the array contains only 2 planes, only one clock cycle is required to input each z-column into the SISOs. This process continues for all z-columns in the array. In order to accomplish this, the RAM access in Table 3 occurs.

TABLE 3

| Clock Cycle Number | RAM Access | z-columns Input |
|---|---|---|
| 1 | Read A0 and B4 | z-columns 0 and 1 |
| 2 | Read A1 and B5 | z-columns 2 and 3 |
| 3 | Read B0 and A4 | z-columns 4 and 5 |
| 4 | Read B1 and A5 | z-columns 6 and 7 |
| 5 | Read A2 and B6 | z-columns 8 and 9 |
| 6 | Read A3 and B7 | z-columns 10 and 11 |
| 7 | Read B2 and A6 | z-columns 12 and 13 |
| 8 | Read B3 and A7 | z-columns 14 and 15 |

This RAM access reads all the data from the code block at two z-columns at a time and four total codeword bits per clock cycle. The RAM access then inputs the data into the two SISO decoders 106. This case differs from the row and column cases discussed above, because the data sent to the first SISO on the first clock is includes of one of the codeword bits read from location A0 and codeword bit read from location B4. Similarly, the data sent to the second SISO on the first clock is the other codeword bit read from location A0 and the other codeword bit read from location B4. Using this method, the SISOs 410 are decoding the z-axis of the code block instead of the x or y axes. This RAM organization method allows each axis to be decoded in the same number of clocks as any other axis and is very efficient in terms of SISO 410 input capacity.

Figure 6:
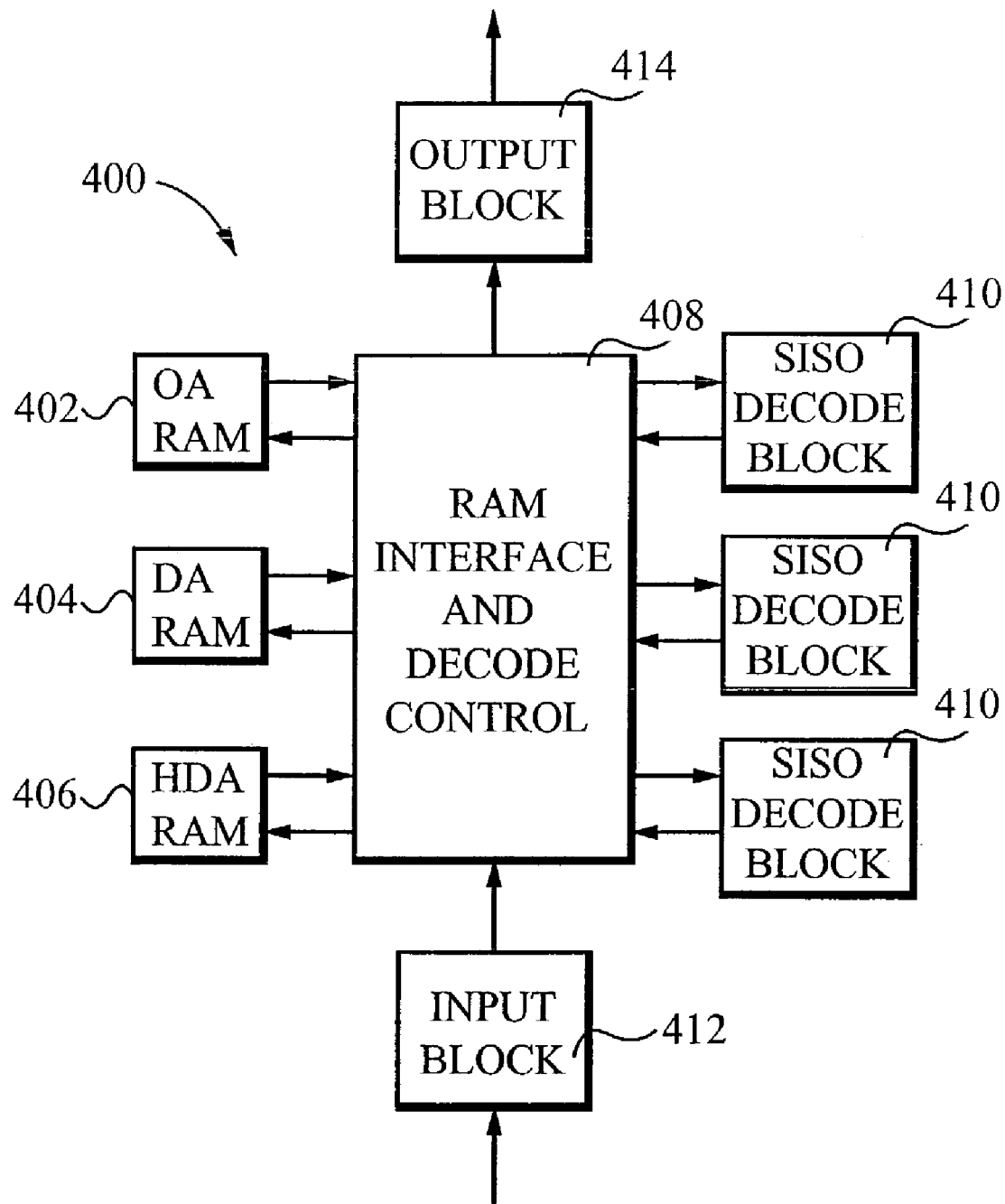
FIG. 6 illustrates a block diagram of the RAM interface module in accordance with the present invention.

FIG. 6 illustrates a block diagram containing a RAM Interface Module 408 in accordance with the present invention. The RAM interface module 408 interfaces with the original array (OA) RAM 402, hard decision array (HDA) RAM 404 and difference array (DA) RAM 406. The RAM interface module 408 also interfaces with an input module 412, an output module 414 and a SISO decode control module 410. The RAM interface module 408 performs the logical to physical mapping of the RAM addresses by converting x, y, and z coordinates into physical RAM addresses. The RAM module 408 also maps the data coming from the RAM bank to the vector block format. All address variations and data mapping changes for different axes are preferably completed transparently to the output module 414. The OA and HDA are preferably set up in a back forth fashion with the OA RAM 402 and HDA RAM 406, respectively. This allows the decoder 106 to process one bank of RAMs while the next code block is input and the previous code block is output. All OA, HDA, and DA RAM banks are logically constructed from one or more RAMs, where each logical RAM bank has a RAM word size data bus. The RAM interface uses a library set to control address generation and data mapping.

The RAM interface module 408 accepts write requests from the OA RAM block 402 on any clock that is enabled. Vector signals in the x, y, and z directions indicate the positions of the values in the OA RAM 402 that are being written. These positions are translated into the physical RAM addresses required for RAM access. The RAM interface module 408 reads the vector positions of the values, modifies the vector block with the input data and then writes the modified vector block back to the RAM bank.

This method can cause a potential "read before write" error event. The "read before write" event is detected by the device 100 when the read address is issued. The RAM read then is cancelled and the forwarding event is placed into a queue that holds it until the replacing data is ready to write.

The write data is then queued until it replaces the cancelled read data. This operation functions on the RAM address that is issued.

An output controller 420 takes read requests from the output module 414 and reads data from the HDA RAM banks 406. The output controller also handles all address resolution and data bus mapping in the RAM interface. The components and operation can be preferably the same as in the input controller interface 408, however the output controller has access to the HDA RAM select mux 424 and outputs 1 vector word to the output block as opposed to a complete vector block. Preferably, a full vector block is read from the RAM bank, and the offset values are used to select the vector that is sent to the output.

Figure 7:
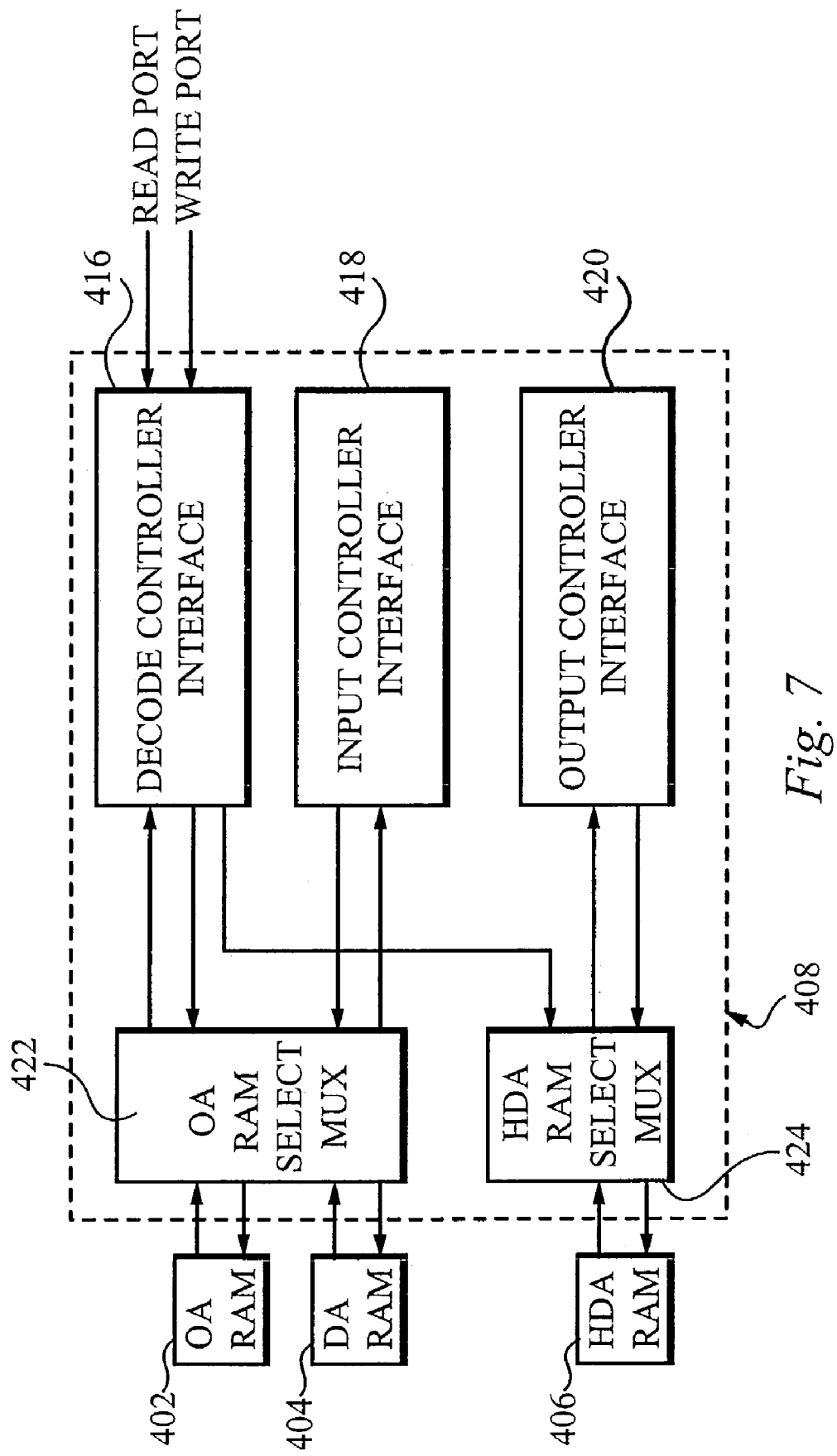
FIG. 7 illustrates a detailed block diagram of the RAM interface module in accordance with the present invention.

A decode controller interface 416, shown in FIG. 7, handles all address resolution and data bus mapping for the decode controller interface. The decoder interface 416 uses read port and write port components to build the two read ports and write port required. The read port of the decode interface 416 handles address generation and data translation for the two read ports of the decoder interface 416. The address generation is done by a RAM address generator (not shown). The RAM address generator returns the RAM block offset values, x_sub, y_sub and z_sub until the corresponding read data return from the RAM. The offset values are used to map the RAM data into a vector block format. This is done by stepping a function call through every position in the vector block. The offset values are delayed using an offset delay pipe component (not shown) which delays the input value for the read pipe delay clocks. The write port handles the writes from the decode controller 416. The write port preferably uses the same method of address generation as the read ports.

Scalable Soft Input/Soft Output Decoder

Figure 8:
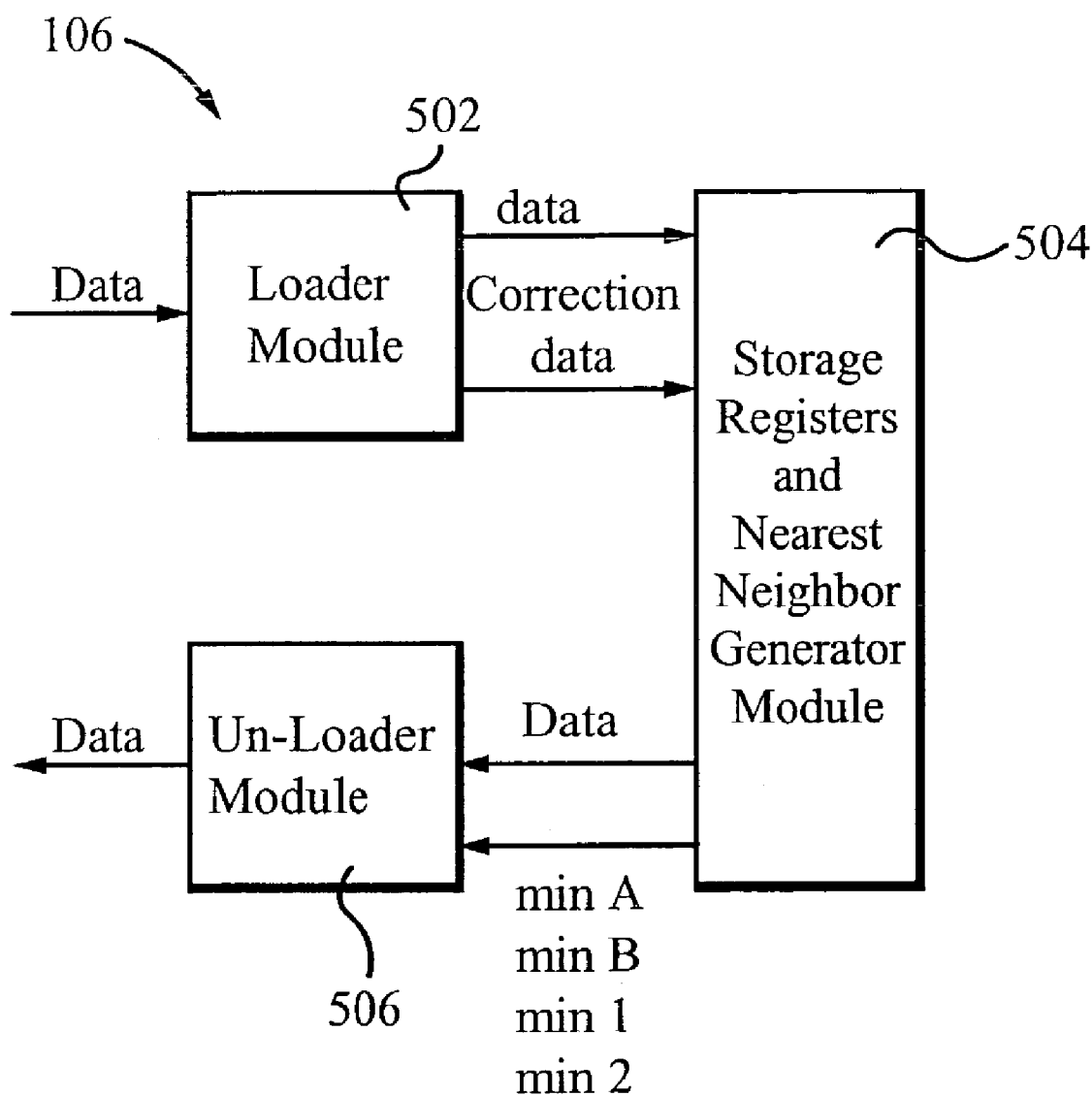
FIG. 8 illustrates a block diagram of the Soft In/Soft Out Decoder in accordance with the present invention.

The system 100 in accordance with the present invention contains at least one variable data rate SISO 410. FIG. 8 illustrates a schematic of the SISO 410 in accordance with the present invention. The SISO 410 is designed to handle multiple soft input bits per clock and also be variable depending on the required speed for the core. The SISOs 410 support variable code range implemented in hardware as well as variable code types and feedback inputs via configurable inputs. The code range is defined by the maximum vector supported by a given core, and the storage space required for that size vector is implemented in the hardware. The SISO 410 is scalable or configured to decode any code type of size up to the maximum vector size. In addition, the SISO 410 can be configured to multiply the output by a feedback constant having a ratio of 1/32 to 31/32. The rate multiplier, which is denoted as d number of data bits, is implemented in most of the SISO 410 as parallel paths, where each path operates on a part of the vector. However, in the loader module 502, a comparison is performed to find the minimum two values in the data vector.

The storage and nearest neighbor generator module 504 in the SISO uses a swapping circuit that is given two addresses in the vector and swaps the soft values at these addresses before outputting the data vector. In addition, the two soft values are summed and the minimum sum over the vector is determined. Since higher data_rate decoders use multiple swaps to occur in parallel, a pipe-lined flip/flop approach may be implemented in the device of the present invention. The first stage of flops is loaded from the input data bus by steps of data_rate. Data_rate is the natural value representing the number of vector values per clock. This value give the number of bit values that are processed in parallel by the SISO 410. After the data bus is full, the first stage is clocked into a second stage of flops. At this point, preferably no swapping has yet occurred. The data is clocked into the second stage so that the first stage can immediately begin loading a following vector without modifying the data from the current vector.

The output of the second pipe stage is preferably connected to a muxing structure within the storage and generator 504 that executes the actual swapping process. The muxing structure pulls data_rate values from the second pipe stage at computed locations and loads the data into a third flop stage starting at location 0 and moving in steps of data_rate. For example, if the data_rate is 2, the nearest neighbor computation engine (described below) determines what locations are to be swapped with locations 0 and 1. These two locations are read from the second flop stage and written into location 0 and 1 of the third flop stage. Next, the computation engine determine what locations to swap with 2 and 3. These locations are read from the second pipe stage and loaded into locations 2 and 3 of the third pipe stage. This continues for the entire data vector. The third pipe stage is unloaded starting with location 0 and moving in multiples of data_rate. Immediately after a location is unloaded, the location is filled with data from the following vector by the swapping circuit described previously.

Nearest Neighbor Calculations

The system 100 utilizes nearest neighbor calculations to reduce the search on a set of codewords defined by finding the nearest neighbor. In addition, within the nearest neighbor function, it is desired to stay in a Galois field to calculate the syndrome and then map that syndrome back to a physical location. This allows a large reduction in hardware over using a standard cyclic syndrome generating circuit and mapping that result back to the H matrix column location, as in the prior art. In addition, the nearest neighbor method of the present invention would utilize a syndrome generating circuit that is many times smaller than the size of similar circuits in the prior art, which thus also consumes less power. Further, since the calculations are reduced to approximately 2 levels of XOR gates, the syndrome generating circuit of the present invention is significantly faster than similar circuits in the prior art. The method of the present invention also removes any "used bit" logic that was necessary when finding nearest neighbors in parallel.

The SISOs 410 in the present invention use a nearest neighbor generator which is built with Galois Field Arithmetic to greatly decrease the extended hamming decode logic. The nearest neighbor computation logic is input LOWi1 and LOWi2 in Galois field representation. The generator XORs the LOWi1 and LOWi2 values with a Nc1 location, which starts from zero and increments through the vector. The result of this XOR is Nc2, which is the location which swaps with Nc1. Since Nc2 is in Galois Field Representation, it is preferably converted into integer representation by taking the Galois field log, as discussed above for the LLR method of the present invention.

The nearest neighbor generator 504 computes the set of Hamming weight 4 codewords with 1s in the 2 lowest confidence bit locations. In the present invention, the codewords are aligned to Galois Field GF($2^x$) where $2^x-1$ is the length of the Hamming code. The 2 lowest confidence locations, LOWi1 and LOWi2 are calculated and given to the nearest neighbor function in a GF ($2^x$) location where Nc1 and Nc2 along with Lowi1 and Lowi2 define the nearest neighbor vectors. The nearest neighbor function uses GF ($2^x$) arithmetic to sum the LOWi1 and LOWi2 locations with a third GF ($2^x$) location to find the Galois Field location of Nc2. The symbols at locations Nc1 and Nc2 are swapped so that the Galois Field representations of the locations are converted to a physical address location by taking the Galois log. The Galois Field can be used to find code syndromes rather than using a sum of the H matrix columns. This is because the Galois Field elements and the H matrix elements are equivalent.

The preferred method of how the SISO 410 of the present invention operates in the present system 100 will now be discussed. The SISO 410 first receives the input data vector and converts the vector into hard decision and soft confidence values. Once this is performed, a syndrome for the codeword is generated by utilizing the Galois Field math, hereinafter referred to as alpha, for each bit in the codeword. Preferably, a 1 bit parity for each bit of the codeword is also generated at the same time. Next, the SISO 410 corrects all locations that the syndrome indicates as having an error. In addition, the SISO 410 corrects the parity bits for each of these locations. Since all values in the codeword are addressed as alphas, there is no mapping necessary. Following, the SISO 410 finds the two minimum values, LOWi1 and LOWi2, which are designated by their respective alpha values. Next, the SISO generates the nearest neighbors by marching Nc1 through all the alpha powers to determine Nc2. The SISO will generally generate all Nc1 and Nc2 pairs twice, except for the parity containing the parity bit, which is generated only once. After Nc2 for all the alpha powers are generated, the SISO swaps all locations, except for the locations that are duplicated. The values of LOWi1 and LOWi2 are swapped and their values are 2's complemented.

After all locations have been swapped, all the swapped values are summed, except for those values that are negative. Once the swapped values are summed, the minimum sum (min1) and the second minimum sum (min2) are determined along with the two locations that generated min1, which are minA and minB. The two locations for min1, minA and minB, are then addressed in alphas. The min1 and min2 values are then converted to linear 2's complement representation, and the locations of minA and minB are replaced. Preferably, minA is replaced by (min2−minA) and minB is replaced by (min2−minB). The value of LOWi1 is thus equal to minA, so the output is the center codeword, and no hard decision bits needs to be inverted as a result. Following, the value of LOWi1 is multiplied by the feedback constant discussed above and converted to 2's complement signed output values. After the values are converted, they are sent to storage registers and mux logic modules which send the hard and soft vectors to the unloader block.

The generator module 504 contains the logic that finds nearest neighbor codewords, corrects LOWi1 and LOWi2, swaps the confidence values between all neighbor Nc1/Nc2 pairs and generates the min1, min2, minA and minB locations. Since the data from the loader is transferred to the generator module 504 as alpha, the data is stored in alpha order. Each group contains data_rate storage locations, where each location is a certain number of bits wide.

Figure 9:
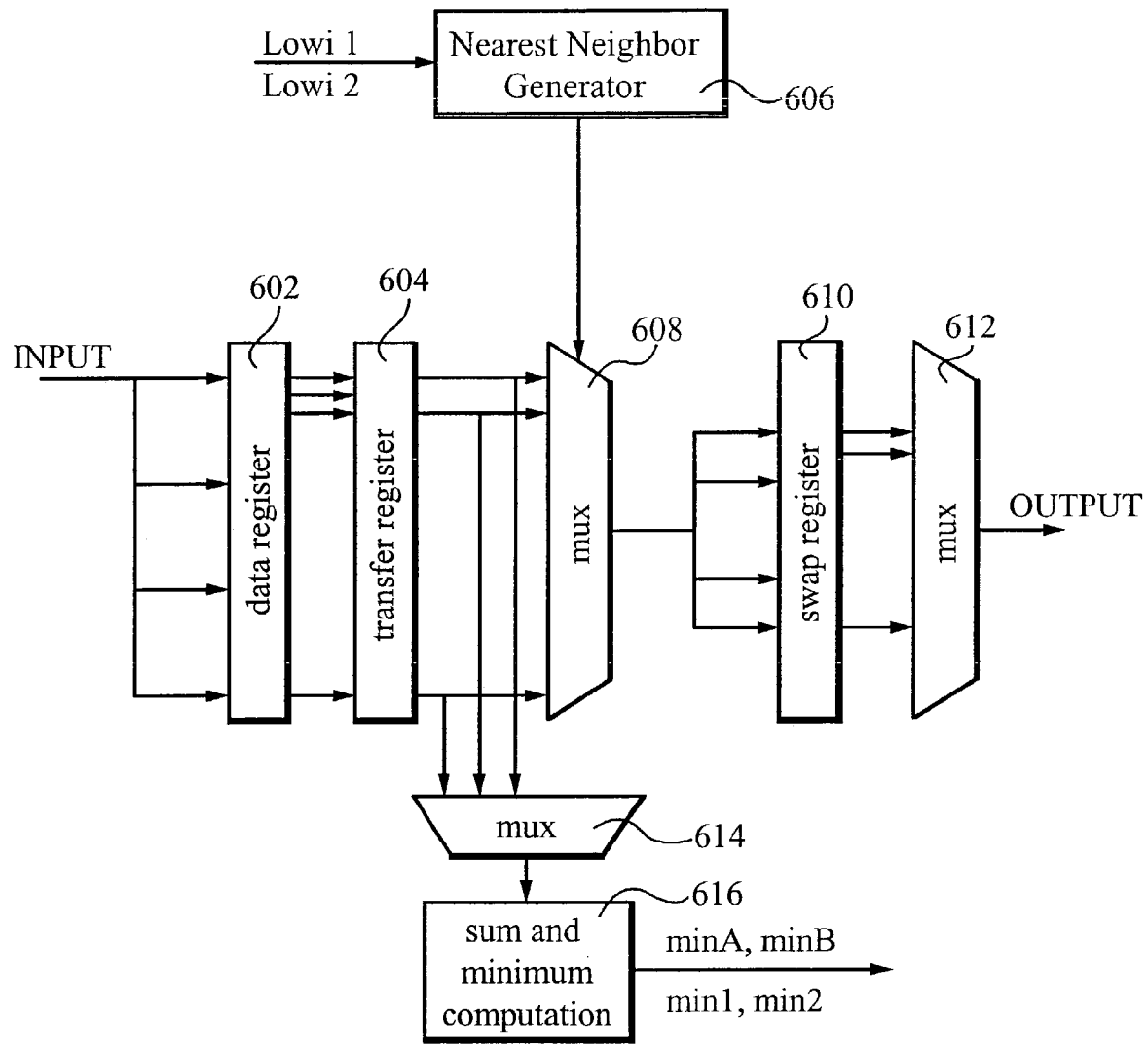
FIG. 9 illustrates a block diagram of the nearest neighbor generator module in accordance with the present invention.

FIG. 9 illustrates a block diagram of the generator module 504 in the SISO 410 of the present invention. The hard data vectors enter the data_reg input registers 602 and the soft values enter the nearest neighbor generator 606. A load_complete signal from the loader block 502 (FIG. 8) indicates the last data transfer for a vector. After the last group of input data is loaded, the entire vector is transferred to a transfer register 604 to allow the generator module 504 to calculate the sums, corrections and minimums while the next vector is being loaded into the data_reg register 602.

For an Extended Hamming code, the generator module 504 receives LOWi1 and LOWi2 from the loader 502 and starts generating nearest neighbor codewords locations after the load_complete signal is received. The generator module 504 generates each Nc2 neighbor using Galois Field math by XORing LOWi1, LOWi2 and the alpha counter input. Each Nc1/Nc2 set is generated twice because the alpha counter counts through every address location, and for the set where Nc1 generates Nc2, the Nc2 location generates Nc1. Likewise, when Nc1 is equal to LOWi1, Nc2 should be equal to LOWi2.

The Nc2 values are then mapped from the alpha set to the physical address set using a direct mapping function. The mapped Nc2 values are registered for use as the mux 608 selects to load the swap register 610 from the transfer register 604. The data in the transfer register 604 is stored in alpha order, which is preferably the same alpha order as in the load address module. Also, the load address module is used as Nc1 to generate Nc2. Nc1 is received for every storage location which generates double Nc1/Nc2 pairs. All of this information is used to load the swap register 610 because for every Nc1 there is a Nc2. The mapped Nc2 address selects the data from the transfer register 604 that is paired with the load address module and stores it as a group at the load address module. The action of storing of the Nc2 value in the alpha location swaps the value of Nc1 and Nc2.

Confidence data from the transfer register 604 is pulled out of the data register 602 and is used to calculate corrections on the data at locations Lowi1 and Lowi2 as well as find the minimum sums min1 and min2. The confidence values are selected out of the transfer register 604 in the same groups as they were loaded. The correction logic incorporates the summing logic to reduce the critical path timing. Preferably, the correction is done if the load address register is equal to LOWi1 or LOWi2. Registering the input into the loader 502 is done due to the data path delay from the transfer register 604. When the correction is equal to two, two positive confidence values are summed. Since the confidence values represent (confidence/2)*0.5, the sum adds an extra 1 to the confidence value. When the correction is equal to one, 1 positive and 1 negative confidence value are summed. Here, the sum is just the 2's complement sum of the confidence values of Nc1 and Nc2, because the (confidence/2)*0.5 of each value cancel the other out. When the number of corrections is zero, two negative confidence values are summed so the sum is the (sum−1). The sum is registered with the load address register.

The registered confidence values are summed and the data_rate sums are compared with the min1 and min2 sums. The lowest sum of the data_rate sums and the two min1 and min2 sums are stored as min1 with the locations that generate min1 stored as minA and minB. The second lowest sum is stored as min2. The locations that generate min2 are stored as minA2 and minB2. MinA2 and minB2 are stored to invalidate the second time a given sum is used in the comparison. Each sum is generated twice because fo the double Nc1/Nc2 pairs. The lowest sum comparison is done where the greater value of the two values becomes a 1. This allows one of the sums to finish the process with a confidence score equal to 0 and the other sum to finish with a confidence score equal to 1. The sum with the confidence score of 0 is the min1 value and the sum with the confidence score of 1 is the min2 value. The minA and minB registers hold the data register address, Nc1 address and Nc2 address that selected the min1 and min2 sum.

In the unload module 506, the Nc1 address is used to select data_rate sets of output data from the data registers

602. Since the stored confidence data represents an (confidence/2)*0.5 value and all confidences in the swap register are positive, the selected data is preferably multiplied by 2 and incremented by 1 to restore the actual confidence value before the correction. The output correction function is similar to the sum datapath correction discussed above. Since the data from 1 vector is unloaded while another vector is loaded, the correction, LOWi1 and LOWi2 values are registered for the output corrections. For instance, when the correction input is "01", the data location at address LOWi1 is corrected. However, if the correction input is "10", the data locations at addresses LOWi1 and LOWi2 are corrected. The data correction includes inverting the hard decision bit and 2's complementing the confidence value. Thus, the confidence values can become negative in this block.

For parity codes, the generator module 504 receives LOWi1 and LOWi2 from the loader 502 after the load_complete signal is received. No neighbors are generated and no sums are calculated. Min1 is the confidence value at location LOWi1 and min2 is the confidence value at location LOWi2. MinA and minB are not used in the parity codes. Even though it is not necessary to calculate sums and minimum for the parity codes, the timing of the output signals is the same as with the extended Hamming codes, which avoids logic in the block. The correction input is valid for the parity codes. The min1 and min2 values are corrected during the output from the generator module 504 when parity codes are selected.

Stop Iterations and Iteration Buffer

Stop iterations are used to allow the decoder 106 to stop decoding when the axis iterations have converged on an answer that all axes agree on. The value of stop iterations is to increase the average throughput of the ETPC decoder 106 or otherwise increase decoder 106 performance. Stop iterations used with an iteration buffer allows a data rate to be set based on an average number of iterations. Stop iterations allow blocks with higher signal to noise ratios to finish early on blocks with lower signal to noise ratios to iterate longer for an overall better decoder performance when compared to setting the maximum iterations at the average.

One way the decoder 106 can detect convergence is for each axis to be decoded with no corrections being done to it. When each axis has been decoded with no corrections, one additional axis is decoded as a last pass to determine the sign of the data for the HDA. Another way the decoder 106 can detect convergence is to check the sign of the previous DA data when the first axis is decoded with corrections. If the previous axis iteration had made corrections but those corrections all agree with the result of the current iterations, the previous axis iteration is used. In this case, after the first iterations are completed with no corrections, the stop iterations function counts 2 good axis iterations toward convergence. The remaining axes of the code are then decoded with no corrections to allow the decoder 106 to stop early. Thus, the decoder 106 of the present invention has a 2 axis improvement over prior art decoder 106s using stop iteration functions.

The sign of the SISO output is used to load the HDA RAM for every axis iteration when the stop iterations function is used. When each axis has been decoded with no corrections, the decoder 106 may be able to use the data in the HDA as the final decoded output rather than going through 1 additional axis iteration to fill the HDA. Otherwise, the decoder 106 is forced to do the additional axis iteration to fill the HDA when any SISO output data is 0. A 0 value out of the SISO indicates that there is no change to the confidence for that specific bit. A negative value out of the SISO adds confidence to the 0 hard decision bits, a positive value adds confidence to the 1 hard decision bits. The 0 value gives no information about the sign of the input data, and no corrections to the data indicates that the decoder 106 did not change the bit. If none of the SISO output data is 0, the decoder 106 will not run the additional axis iteration, and the decoding is complete.

The savings of 1 axis iteration at the start of detecting convergence and 1 axis iteration at the end of the decoding gives the possible 2 axis iteration savings over prior art decoder's 106 stop iteration functions. The addition of hyper codes adds some specific conditions to validating the previous DA as a good axis iteration. In a 2 dimensional block of data with a hyper code, the preferred order of decoding the axes is columns, then rows and then the diagonals where the row may be unencoded. Since the hyper axis concatenates to the block such that the block has one more row than column, the column or y-axis can not validate the action of the hyper axis. In other words, the previous DA can not be counted toward convergence, because the y-axis doe not decode the last row of data in the hyper axis.

For a 3 dimensional block of code, the preferred order in which the axes are decoded are columns first, then rows which are followed by the planes. Following, the hyper axis is decoded. The x-axis and/or y-axis may possibly be encoded. In 3 dimensional codes with a hyper axis, the z-axis is one plane shorter than all other axes. Thus, the axis previous to the z-axis cannot be validated by the z-axis.

Figure 10A:
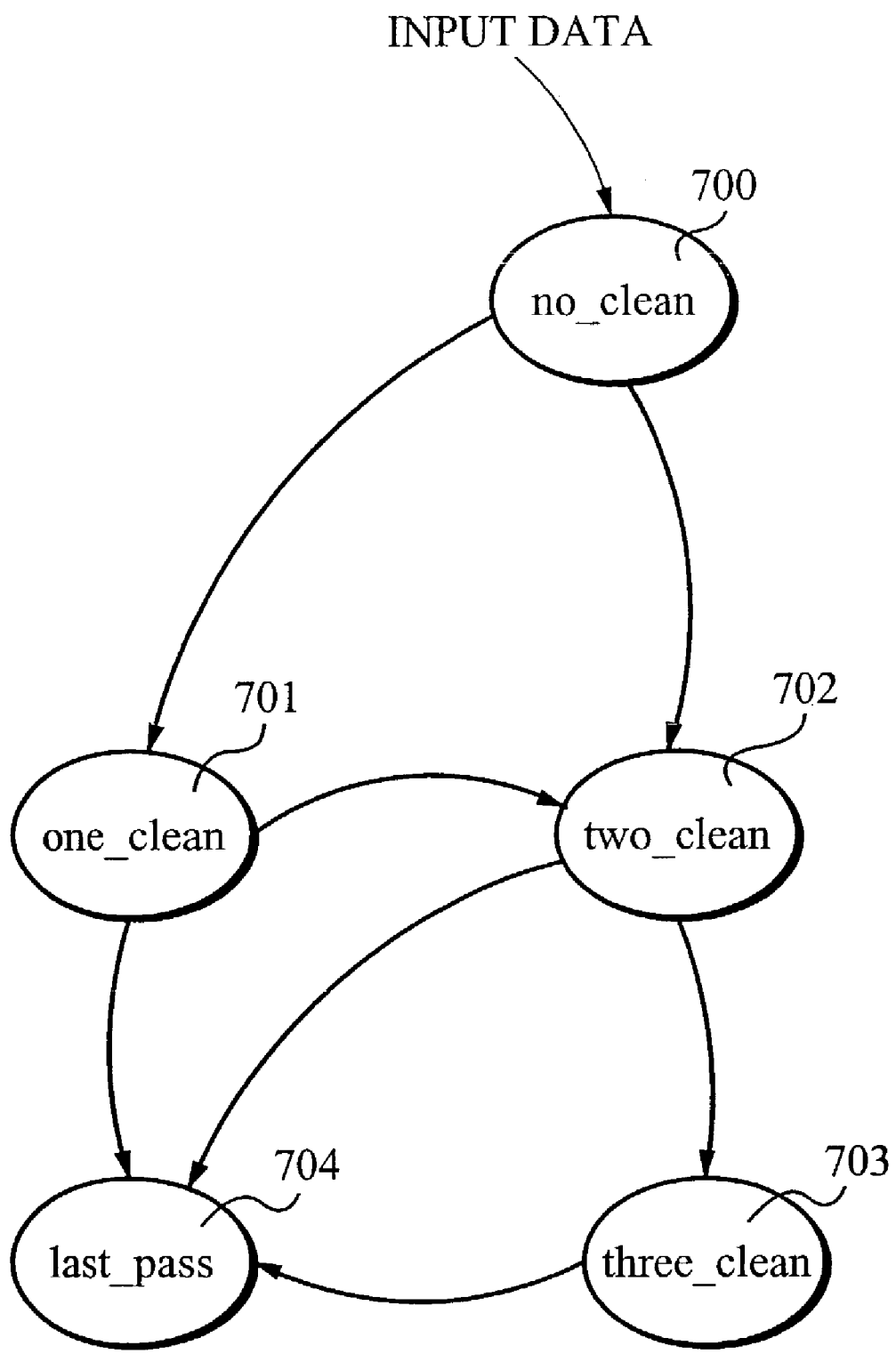
FIGS. 10a–e illustrate a flow charts of the stop iterations function in accordance with the present invention.
Figure 10B:
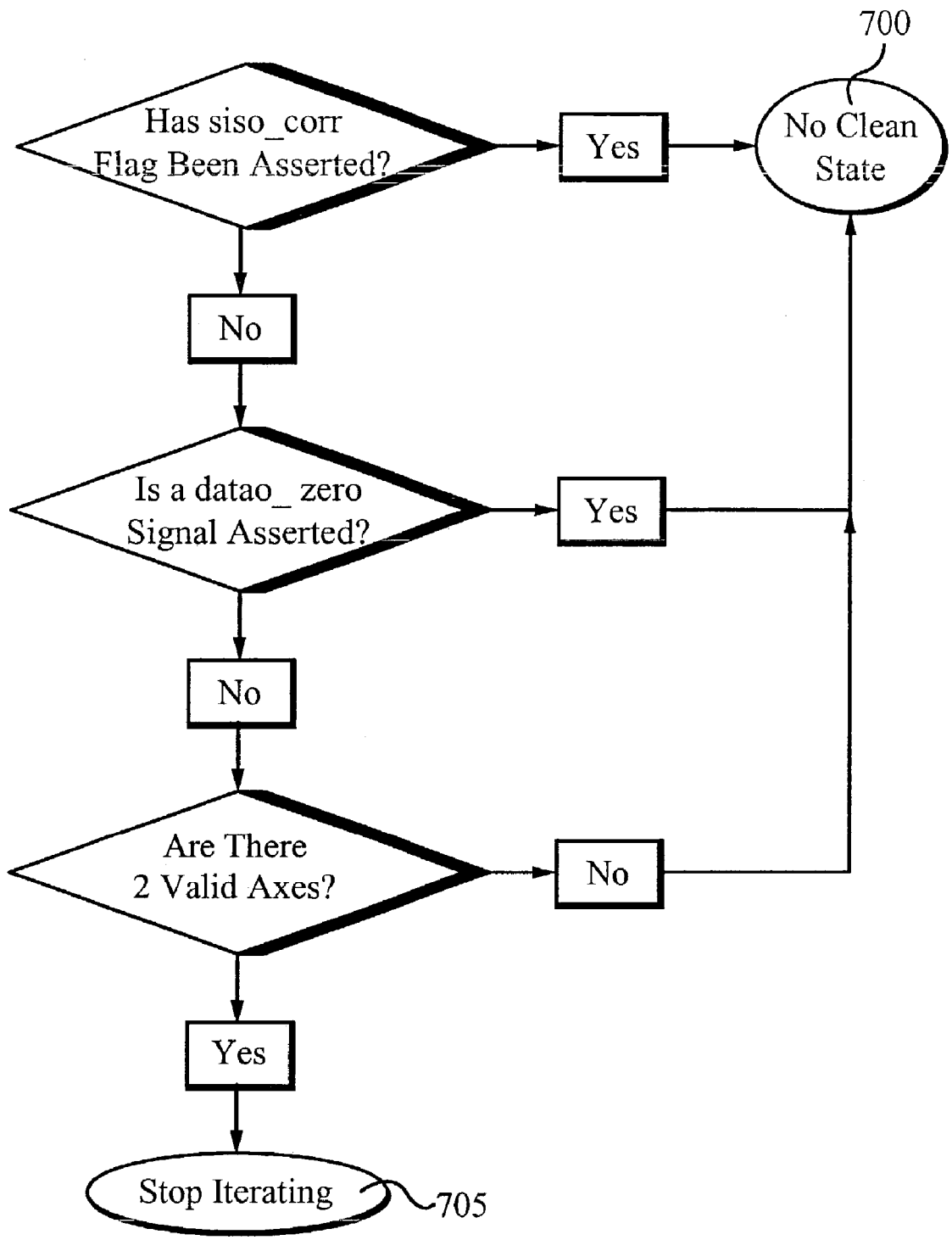

FIG. 10a illustrates a flow chart of the stop iteration function method in a state machine of the system 100. As shown in FIG. 10b, the encoded data enters the no_clean state 700 of the stop iterations finite state machine. A siso_corr flag may be asserted if any corrections are made by the SISO during axis iteration. If a siso_corr flag is present, the encoded data will be forced to the no_clean state 700 when entering the decoder 106. After the data passes through the no_clean state 700, a control signal, signs_match, may be added as a flag to assert whether the sign of the input to the SISO matches the sign of the previous DA data. If the signs match, then the previous axis iteration has added confidence to 1s and 0s which indicates that the block is converging. This flag allows the stop iterations function to stop 1 axis earlier than having to wait for each axis to finish with no corrections. In addition, a data_zero signal may be asserted to the encoded data if the output of the SISO is 0. A 0 output from the SISO does not indicate if the sign of the input is a 1 or 0, so the HDA input cannot be determined. The decoder 106 is forced to run another axis iteration whenever a datao_zero signal is present. Thus, if a datao_zero signal is present when the data enters the state machine, the data passes to the no_clean state 700.

Figure 10C:
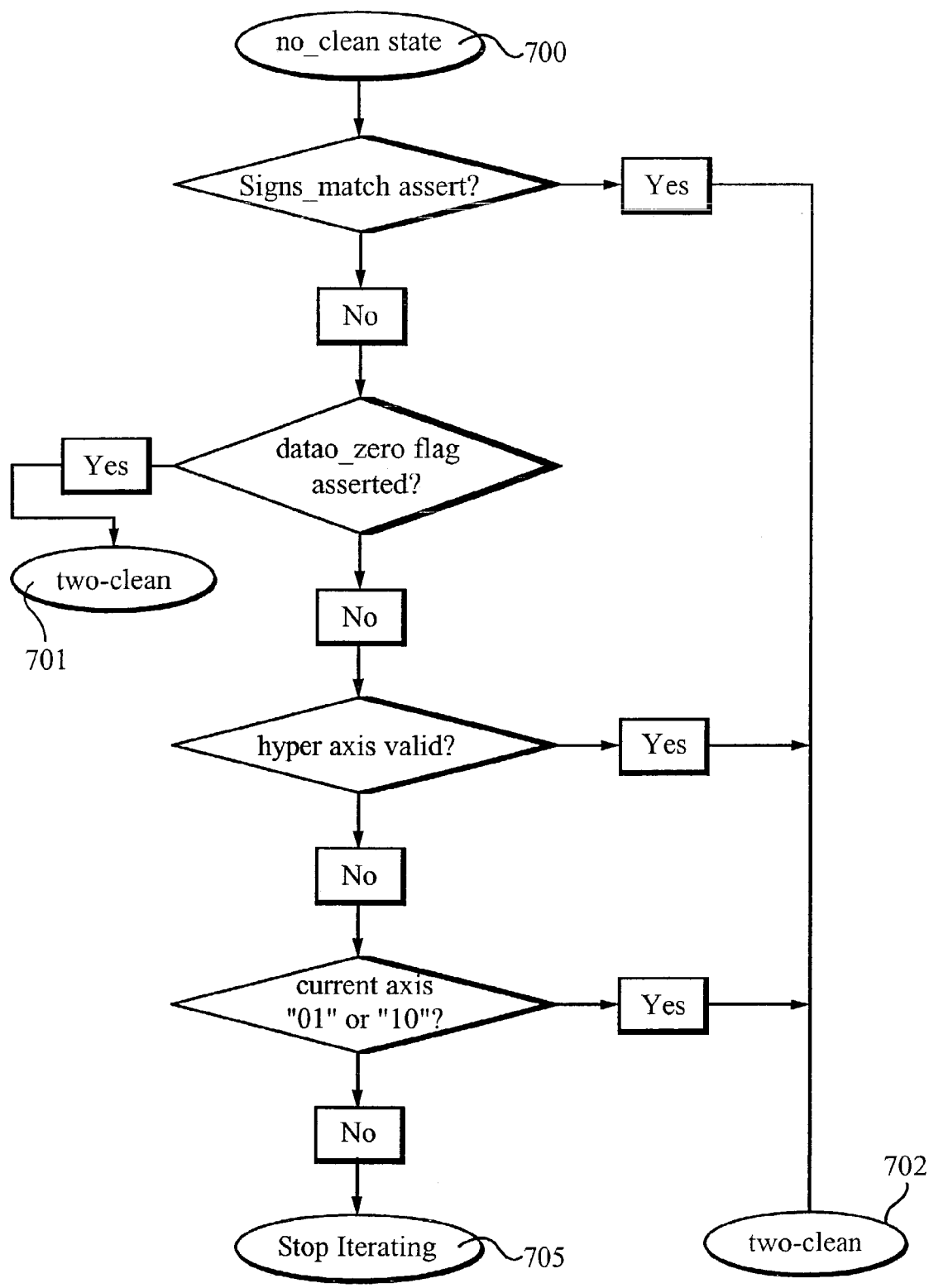

FIG. 10c illustrates a flow chart of the stop iteration function in the no_clean state 700. After the data passes through the no_clean state 700, the data may be sent to either the one_clean state 701 or two_clean state 702, depending on whether the signs_match signal is asserted. If the signs_match signal is asserted, the data is passed onto the two_clean state 702. However, if no signs_match signal is asserted, the system 100 determines whether a datao_zero signal is present. If a datao_zero signal is asserted after the data passes through the no_clean state 700, the data is sent to the one_clean state 701. Then, either the stop iteration function may be complete 705 or the data may be sent to the two_clean state, depending on the current axis being decoded and the hyper axis. The dec1_axis signal represents the current axis being decoded, whereas the hyp_valid signal represents a valid hyper axis. If the decoder 106 sees that the hyper axis is not valid and the current axis being decoded is not either "01" or "10", then the stop iteration function is complete 705. Otherwise, the data is sent to the two_clean state 702.

Figure 10D:
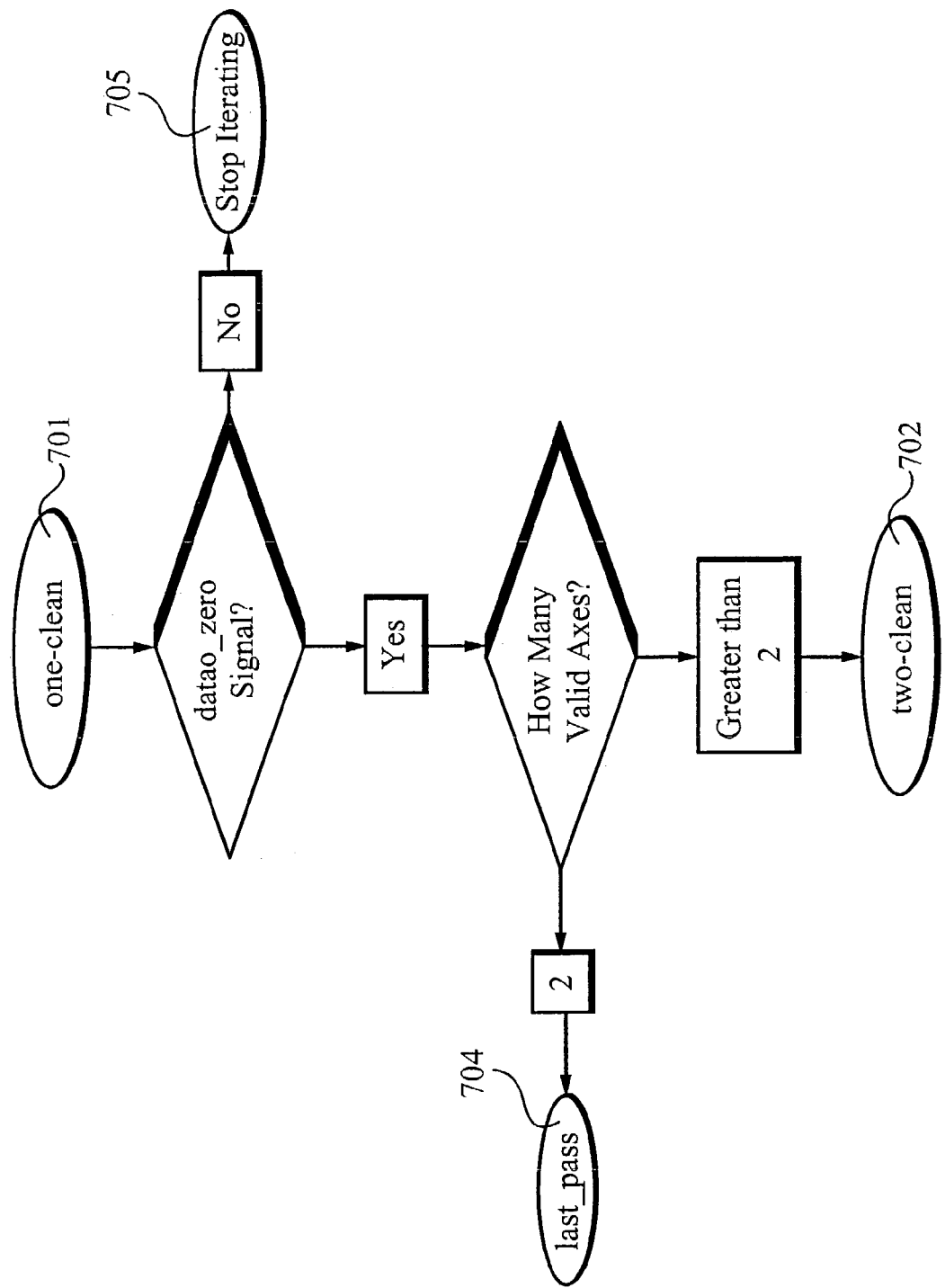

After the encoded data is sent to the one_clean state 701, it undergoes another iteration. As shown in FIG. 10*d*, the decoder 106 will stop iterating 705 after the data has entered the one_clean state 701, if there is no datao_zero signal asserted. However, if a datao_zero signal is present after the data undergoes the iteration through the one_clean state 701, the data will be passed either to the two_clean state 702 or the last_pass state 704, depending on the number of coded axes. If the number of coded axes is greater than 2, the encoded data is sent to the two_clean state 702, whereas the data will be sent to the last_pass state 704 if the number of valid axes is equal to 2.

Figure 10E:
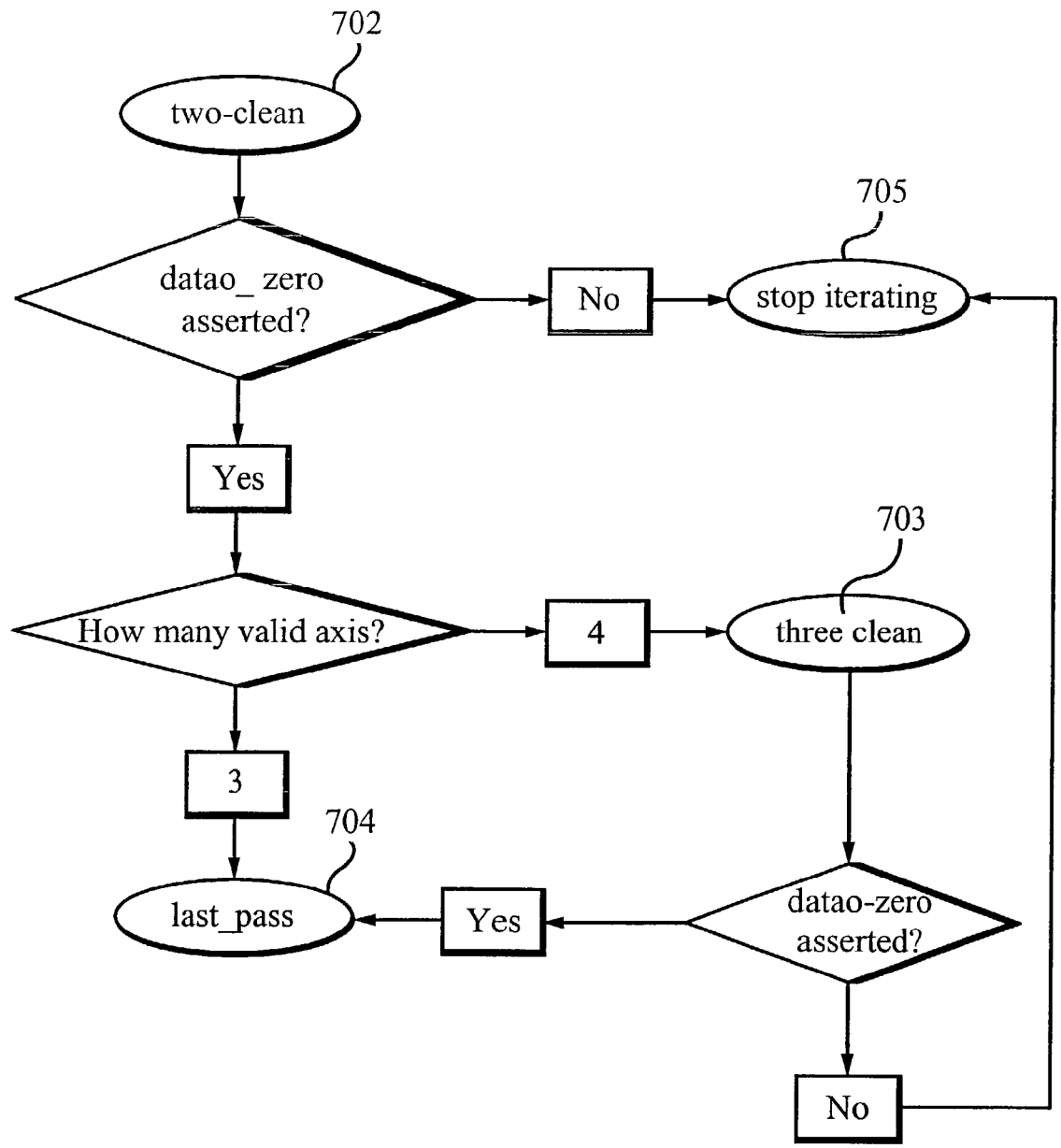

After the encoded data is sent to the two_clean state, it undergoes another iteration. As shown in FIG. 10*e*, the decoder 106 will stop iterating after the data has entered the two_clean state 702 if there is no datao_zero asserted. However, if a datao_zero signal is present after the data undergoes the iteration through the two_clean state 70, the data will be passed either to the three_clean state 703 or the last_pass state 704, depending on the number of coded axes. The data will be sent to the last pass state 704 if the number of coded axes is 3. In contrast, if the number of coded axes is 4, then the data is sent to the three clean state 703.

If the encoded data is sent to the three_clean state 703, it undergoes another iteration. As shown in FIG. 10*e*, the decoder 106 will stop iterating after the data has entered the three_clean state 703 if there is no datao_zero signal asserted. Otherwise, the data is iterated again and sent to the last_pass state 704 if a datao_zero signal is asserted.

The decoder 106 of the present invention can be configured to run a variable number of iterations. The device 100 preferably contains an internal buffering module to allow a variable number of iterations per block with a constant data flow through the device 100. When the decoder 106 requires more iterations on certain blocks, the buffer stores incoming data bits until the decoder 106 completes the block. It is preferred that a second logical buffer is placed on the output of the decoder 106 to give a fixed latency to the decoder 106. The logical size of this buffer may be set by a buffer register. Setting the buffer size to a larger value allows the decoder 106 to iterate more times on difficult blocks. Setting this size to a smaller value decreases the latency through the device 100. The buffer may be set such that the decoder 106 stops iterating when the input buffer fills. Thus, when the input buffer becomes nearly full, the device will automatically stop iterating on the current block and send the block to the output buffer. After the block is sent to the output buffer, the device 100 will begin loading the next block.

The iteration buffer allows the decoder 106 of the present invention to operate at an average iteration level set by the required signal to noise level performance and data rate. The performance of the decoder 106 is a function of the number of iterations that the decoder 106 performs on a code block. The iteration buffer takes advantage of the decoder 106's stop iteration function described above to allow easily decoded blocks to finish before the average iteration number while allowing difficult blocks to iterate longer. The buffer prevents underflow and regulates overflow by controlling a dump block input. When a signal is asserted on the dump block, the decoder 106 will finish the current axis iteration and then perform a last axis iteration. When this occurs, it is likely that the output data will contain decoding errors since the decoder 106 is forced to stop iterating. The iteration buffer also gives the decoder 106 added flexibility to perform at a better signal to noise level at any given iteration number in comparison to the prior art decoder 106*s*, which have a fixed number of iterations it must run to reach a certain signal to noise level. In addition, the iteration buffer can allow fewer bits of internal resolution for a size improvement or a lower average iteration level for a faster data rate.

In the preferred embodiment, the iteration buffer can be configured for bypass mode, streaming mode or FIFO mode. In bypass mode, data fed into the iteration buffer is passed directly to the decoder 106, and the data out of the decoder 106 is passed directly out to the iteration buffer. In streaming mode, the iteration buffer allows the decoder 106 to run at an average iteration level. The performance of the decoder 106 is a function of the number of iterations that the decoder 106 is configured to run. The iteration buffer allows the decoder 106 to use the stop iterations function to allow easily decoded blocks to finish before the average iteration number and difficult blocks to iterate longer. The iteration buffer controls the dump block to force the average iteration level necessary to keep a constant output data flow. In the FIFO mode, the iteration buffer operates as 2 independent FIFOs. One FIFO is used to buffer the input data and output the data to the decoder 106. The other FIFO buffers the output data from the decoder 106.

The iteration buffer has several configuration input signals which are registered with the iteration buffer for every clock. A buffer_enable signal asserts whether the input data is to be routed through the iteration buffer to the decoder 106 or directly to the decoder 106. A buffer_mode signal tells the iteration buffer whether to run in buffer or FIFO mode. When the buffer_mode is cleared, the RAM of the iteration buffer is set to FIFO mode and is split into two sections. When the buffer_mode is set, the buffer RAM is set in buffer mode. A buffer_size signal determines the size of both the input and output FIFOs in steps of 128 symbols when the buffer_mode is cleared. When the buffer_mode signal is set, it is used to prime the iteration buffer at startup. The iteration buffer does not output data until a predetermined number of bits are written to the iteration buffer. In other words, the buffer does not output data until the difference between the pointers is equal to the buffer_size. The buffer_size is preferably set to (n–k)+64 bits smaller than the number of symbols in the physical RAM where n is equal to the total number of input frame bits and k is the smallest number of output bits per frame. The (n–k) extra bits allow the output of the iteration buffer to read slower than the input writes. The added 64 bits are used to allow for variances in the input/output clock ratio. In addition, it is preferred that the buffer-size be smaller than the space required to hold 8 data packets.

As stated above, the iteration buffer determines the minimum difference in 128 bit steps between the number of symbols stored in the input FIFO and the buffer_size. This ensures that the input will not overfill the iteration buffer in FIFO mode. When buffer_mode is set, the lock threshold signal determines the minimum difference in 128 bit steps between the number of bits written to the iteration buffer from the decoder 106 and the number of bits output from the iteration buffer. This ensures that there will always be data available for output. The lock threshold signal is set to allow time for 2 axis iterations plus latency through the output before the iteration buffer input overflows.

The iteration buffer is connected to the decoder 106 module whereby several signals are sent back and forth between the two. Of these signals, gal_rsync is an input synchronize signal received by the decoder 106 which indicates that the input data value is the first value in a new block. This is also held active for each transfer into the decoder 106 between the gal_rsync being received and the start of a new block. The gal_osync signal represents the output synchronization status of the received data in the decoder 106. This signal is asserted after the transfer of the last nibble of a block is received, whereby the signal is held for one clock. The gal_ordy signal indicates that the buffer has filled to the lock threshold when the buffer_mode is active. The gal_ordy signal also indicates that data is available in the output FIFO when the buffer_mode is not active. This signal is asserted until the buffer is empty.

In FIFO mode, the iteration buffer preferably acts like 2 separate FIFOs. The size of each of the FIFOs is set by a buffer_size configuration bus. There are no offsets required when the buffer is set to FIFO mode. The input FIFO stores input data and outputs data to the decoder 106. Both of these sets of data are in blocks of n bits. The output FIFO stores data written from the decoder 106 in blocks of k bits. Both of these FIFOs are preferably independent from each other. The output FIFO will accept data when it has space available and be ready to output data when it has valid data to output.

In FIFO mode, the lock threshold is defined as the minimum difference, in steps of 128 symbols, between the number of symbols written to the iteration buffer and the number of bits output. This ensures that the input will not overfill in FIFO mode. The full threshold is configured to allow time for the decoder 106 to finish decoding and unload the decoded data before the input overflows. The output FIFO has no connection with the input FIFO and does not know if a dump_block is issued.

In the buffer mode, the iteration buffer is preferably implemented using a single 2 port RAM with 4 address pointers and 1 threshold level. ETPC blocks of data are input to the decoder 106 without going through the iteration buffer RAM. Preferably, the time to decode the block of data is equivalent to the time to load and unload the block. The iteration buffer allows the decoder 106 vary its loading and unloading as well as allows the decode to decode for some blocks that are longer than average. The buffer is filled to the full threshold discussed above before any data is output from the buffer.

The write pointer in the decoder 106, gal_wr, jumps to the start of the next block after the last decoded ETPC nibble is written to the decoder 106. The last decoded ETPC nibble is known, because the decoder 106 signals the last output nibble. The jump location is stored in a FIFO when the first data of a ETPC block is written to the address pointed to by the pluto_wr. The first data of a ETPC block is signaled by the frame synch module. Since the first block out of the decoder 106 is stored in the same location as the first block in, the address on the top of the FIFO is the address for the gal_wr pointer to jump to at the end of the block.

There are preferably three FIFOs used to stored 8 ETPC start addresses. One of the FIFOs is used as described above for the gal_wr pointer offset. The second pointer is used to store the pluto_rd pointer offset and the third is used to control the decoder 106 resynchronization function discussed above. The FIFOs preferably operate independently of each other.

Figure 11:
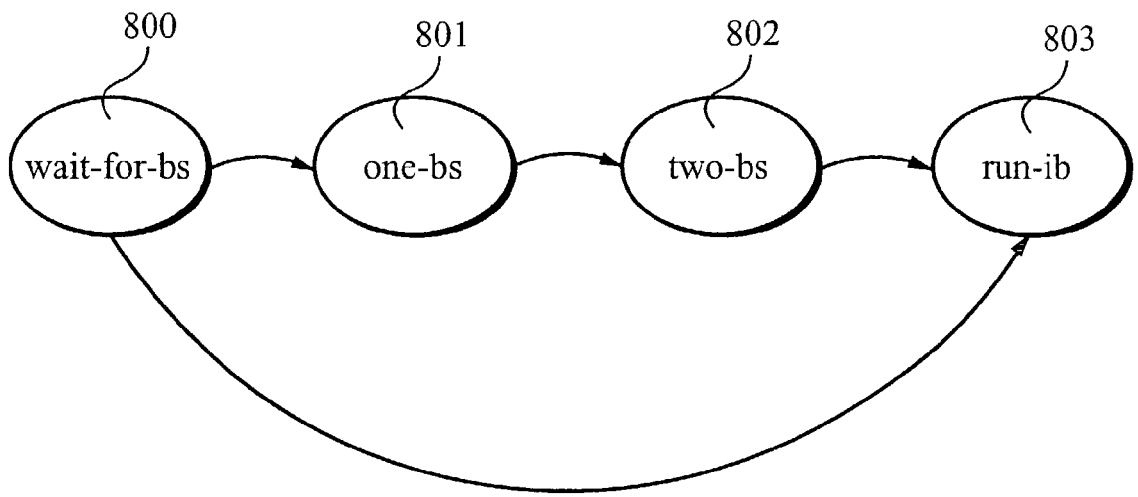
FIG. 11 illustrates a flow chart of the stop iterations process in accordance with the present invention.

FIG. 11 illustrates a flow chart of the stop iteration process. The iteration buffer initially waits for the block_start and buffer_enable signals to be asserted. If the buffer is in buffer mode and receives these two signals, the buffer enters the one_bs state 801. However, if the buffer is not in the buffer mode, the buffer enters directly into the run_ib state 803. If the buffer is in buffer mode and enters the one_bs state 801, if the buffer receives a load_buffer signal, the buffer enters the two_bs state 802 and continues to the run_ib state 803.

The iteration buffer starts to unload data after the block is loaded. Since the data is loaded faster than it is unloaded, the pointers continue to diverge until the upload is finished. This allows the buffer_size to be (n–k) bits plus 16 locations smaller than the physical RAM size. The added 16 locations are used to allow for variances in the pluto input/output clock ration. At the end of the unloaded block, the pluto_rd point jumps to the location of the start of the next block which sets the pointer difference back to the buffer_size.

Preferably, the gal_rd pointer should be ahead of the gal_wr pointer, otherwise the input data to the decoder 106 may become corrupted. The pluto_rd pointer should be ahead of the pluto_wr pointer, otherwise the output data may become corrupted. The gal_wr pointer should be ahead of the pluto_rd pointer, otherwise the output data is useless, because it will not be written to the decoder 106. Also, the pluto_wr pointer should be ahead of the gal_rd pointer. Otherwise, the decoder 106 output data is useless, because it will not be written to the buffer output.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modification s may be made in the embodiment chosen for illustration without departing from the spirit and scope of the invention.

What is claimed is:

1. A method of organizing an encoded codeword, said encoded codeword having a plurality of codeword bits, said method comprising:
 a. receiving the encoded codeword;
 b. assigning multiple codeword bits to at least one memory address in a plurality of memory addresses; and
 c. iteratively decoding the received codeword by utilizing the plurality of memory addresses in a predetermined order, wherein the predetermined order is based on a dimension of the received codeword.

2. The method of organizing according to claim 1 wherein each of the plurality of memory addresses further comprises a first component and a second component.

3. The method of organizing according to claim 2 wherein the first component is representative of a physical memory, wherein means for decoding associated with the physical memory decodes a unique memory address.

4. The method of organizing according to claim 2 wherein the second component is representative of a physical memory address.

5. The method of organizing according to claim 1 wherein storing the codeword further comprises:
 a. reading the codeword in a received order;
 b. storing a portion of the codeword bits associated with the at least one memory address;
 c. retrieving the portion of the codeword bits for said memory address; and
 d. storing a predetermined number of remaining codeword bits associated with the memory address with the retrieved portion of codeword bits.

6. The method of organizing according to claim 1 wherein the predetermined order allows multiple decoders to decode more than one dimension of the codeword independently of one another.

7. The method of organizing according to claim 1 wherein more than one bit in the set of predetermined bits is read by one decoder in a single memory access.

8. The method of organizing according to claim 1 wherein the predetermined order of the plurality of memory addresses are read by a plurality of decoders in a single memory access.

9. The method of organizing according to claim 1 wherein the codeword is a multi-dimensional turbo product code.

10. A decoding system for decoding a plurality of encoded bits in a received codeword, the decoding system comprising:
   a. at least one memory module for assigning multiple encoded bits in the codeword to a unique address, wherein the codeword has a plurality of unique addresses; and
   b. at least one decoder for decoding the plurality of unique addresses in a predetermined order based on a dimension of the codeword.

11. The decoding system according to claim 10 wherein the at least one memory module further comprises at least one memory bank for storing the set of bits, wherein the at least one memory module reads the set of predetermined bits from the memory bank.

12. The decoding system according to claim 11 wherein the at least one memory bank further comprises an original array memory.

13. The decoding system according to claim 11 wherein the at least one memory bank further comprises a difference array memory.

14. The decoding system according to claim 11 wherein the at least one memory bank further comprises a hard decision array memory.

15. The decoding system according to claim 11 wherein the at least one memory module communicates a set of decoded bits associated with the set of predetermined bits to the memory bank utilizing the unique address of the set of predetermined bits.

16. The decoding system according to claim 10 wherein the codeword is a multi-dimensional turbo product code.

17. The decoding system according to claim 10 wherein the predetermined order allows multiple decoders to decode more than one dimension of the codeword independently of one another.

18. The decoding system according to claim 10 wherein more than one bit in the unique address is read by one decoder in a single memory access.

19. The decoding system according to claim 10 wherein the plurality of unique addresses are read by a plurality of decoders in a single memory access.

* * * * *